United States Patent
Im et al.

(10) Patent No.: US 9,472,767 B2
(45) Date of Patent: Oct. 18, 2016

(54) ORGANIC LIGHT-EMITTING DEVICE AND METHOD OF MANUFACTURING THE SAME

(75) Inventors: Ja-Hyun Im, Yongin (KR); Ji-Hwan Yoon, Yongin (KR); Byung-Hoon Chun, Yongin (KR); Bum-Suk Kim, Yongin (KR)

(73) Assignee: Samsung Display Co., Ltd., Yongin-si, Gyeonggi-Do (KR)

( * ) Notice: Subject to any disclaimer, the term of this patent is extended or adjusted under 35 U.S.C. 154(b) by 576 days.

(21) Appl. No.: 13/042,561

(22) Filed: Mar. 8, 2011

(65) Prior Publication Data

US 2011/0215308 A1   Sep. 8, 2011

(30) Foreign Application Priority Data

Mar. 8, 2010   (KR) .................. 10-2010-0020402

(51) Int. Cl.
*H01L 51/50* (2006.01)
*H01L 51/00* (2006.01)

(52) U.S. Cl.
CPC ......... *H01L 51/0061* (2013.01); *H01L 51/006* (2013.01); *H01L 51/0072* (2013.01); *H01L 51/0039* (2013.01); *H01L 51/0058* (2013.01); *H01L 51/0077* (2013.01); *H01L 51/0086* (2013.01); *H01L 51/0087* (2013.01); *H01L 51/5048* (2013.01); *H01L 51/5052* (2013.01)

(58) Field of Classification Search
USPC ............... 428/690, 917; 313/504, 505, 506; 257/40, E51.05, E51.026, E51.032, 257/E51.052; 548/304.1, 418, 440; 564/26, 564/426, 434, 433
See application file for complete search history.

(56) References Cited

U.S. PATENT DOCUMENTS

| | | | |
|---|---|---|---|
| 5,792,567 A * | 8/1998 | Kido et al. | 428/690 |
| 2003/0189401 A1 | 10/2003 | Kido et al. | |
| 2004/0113547 A1* | 6/2004 | Son et al. | 313/504 |
| 2004/0185298 A1* | 9/2004 | Lee et al. | 428/690 |
| 2005/0221124 A1* | 10/2005 | Hwang et al. | 428/690 |

(Continued)

FOREIGN PATENT DOCUMENTS

| | | |
|---|---|---|
| JP | 2003-229269 A | 8/2003 |
| JP | 2004-207000 A | 7/2004 |

(Continued)

OTHER PUBLICATIONS

Korean Registration Determination Certificate issued by KIPO on Nov. 14, 2011, corresponding to KR 10-2010-0020402 and Request for Entry attached herewith.

(Continued)

*Primary Examiner* — Gregory Clark
(74) *Attorney, Agent, or Firm* — Robert E. Bushnell, Esq.

(57) ABSTRACT

An organic light-emitting device and a method of manufacturing the same. The organic light-emitting device includes a substrate, a first electrode formed on the substrate, a second electrode, an emission layer between the first electrode and the second electrode, a hole transport layer between the first electrode and the emission layer, and an electron transport layer between the second electrode and the emission layer. The hole transport layer includes a first hole transport unit comprising: a first hole transport layer comprising a hole transporting material, a third hole transport layer formed on the first hole transport layer and comprising a charge generating material; and a fifth hole transport layer formed on the third hole transport layer and comprising the hole transporting material.

18 Claims, 9 Drawing Sheets

(56) References Cited

U.S. PATENT DOCUMENTS

| | | |
|---|---|---|
| 2007/0042221 A1 | 2/2007 | Kawamura |
| 2007/0048548 A1 | 3/2007 | Kim et al. |
| 2007/0132370 A1 | 6/2007 | Boerner et al. |
| 2007/0141396 A1 | 6/2007 | Chun et al. |
| 2008/0278066 A1 | 11/2008 | Spindler et al. |
| 2008/0284317 A1 | 11/2008 | Liao et al. |
| 2009/0091242 A1 | 4/2009 | Liao et al. |
| 2009/0232976 A1 | 9/2009 | Yoon et al. |
| 2009/0233125 A1 | 9/2009 | Choi et al. |

FOREIGN PATENT DOCUMENTS

| | | |
|---|---|---|
| JP | 2007-123611 | 5/2007 |
| JP | 2007-173780 A | 7/2007 |
| JP | 2008-251626 A | 10/2008 |
| JP | 2008-258603 A | 10/2008 |
| JP | 2009-215644 A | 9/2009 |
| KR | 2004-0065667 | 7/2004 |
| KR | 1020060014410 A | 2/2006 |
| KR | 10-2006-0131744 A | 12/2006 |
| KR | 10-2007-0023078 A | 2/2007 |

OTHER PUBLICATIONS

Extended European Search Report issued May 9, 2012 in connection with European Patent ApplicationSerial No. 11157291.3, which also claims Korean Patent Application Serial No. 10-2010-0020402 as its priority document.

Japanese Office Action issued by Japanese Patent Office on Nov. 11, 2014 in corresponding Japanese Patent Application No. 2011-049978 and Request for Entry of the Accompanying Office Action attached herewith.

Korean Office Action issued by Korean Patent Office on Jun. 21, 2011, corresponding to Korean Patent Application No. 10-2010-0020402 and Request for Entry of the Accompanying Office Action attached herewith.

\* cited by examiner

ORGANIC LIGHT-EMITTING DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Mar. 8, 2010 and there duly assigned Serial No. 10-2010-0020402.

BACKGROUND OF THE INVENTION

1. Field of the Invention

One or more embodiments of the present invention relate to an organic light-emitting device and a method of manufacturing the same.

2. Description of the Related Art

Organic light-emitting devices (OLEDs), which are self-emitting devices, have advantages such as a wide viewing angle, excellent contrast, quick response, high brightness, excellent driving voltage characteristics, and can provide multicolored images.

A typical OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic thin films formed of organic compounds.

An operating principle of an OLED having the above-described structure is as follows.

When a voltage is applied to the anode and the cathode, holes injected from the anode move to the EML via the HTL, and electrons injected from the cathode move to the EML via the ETL. The holes and electrons recombine in the EML to generate excitons, and when the excitons drop from an excited state to a ground state, light is emitted.

In order to manufacture an OLED having excellent characteristics such as high efficiency and long lifetime, the injection and flow of holes and electrons are required to be balanced.

SUMMARY OF THE INVENTION

One or more embodiments of the present invention include an organic light-emitting device (OLED).

One or more embodiments of the present invention include a method of manufacturing the OLED.

Additional aspects will be set forth in part in the description which follows and, in part, will be apparent from the description, or may be learned by practice of the presented embodiments.

According to one or more embodiments of the present invention, an organic light-emitting device includes: a substrate; a first electrode; a second electrode; and a hole transport layer, an emission layer, and an electron transport layer between the first electrode and the second electrode, wherein the hole transport layer includes at least one hole transport unit including: a first hole transport layer including a hole transporting material; a third hole transport layer formed on the first hole transport layer and including a charge generating material; and a fifth hole transport layer formed on the third hole transport layer and including the hole transporting material, and the electron transport layer includes an electron transporting material and a metal-containing material.

The hole transport unit may further include at least one layer selected from the group consisting of a second hole transport layer interposed between the first hole transport layer and the third hole transport layer and including the hole transporting material and the charge generating material, and a fourth hole transport layer interposed between the third hole transport layer and the fifth hole transport layer and including the hole transporting material and the charge generating material.

The hole transporting material may be represented by one selected from the group consisting of Formulae 1 and 2 below:

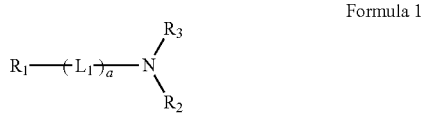

Formula 1

Formula 2

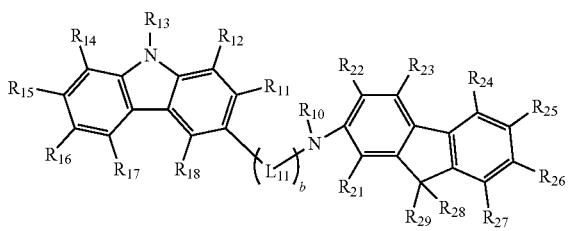

wherein $R_{10}$ is represented by $—(Ar_1)_n—Ar_2$; $R_{16}$ is represented by $—(Ar_{11})_m—Ar_{12}$; $Ar_1$, $Ar_{11}$, $L_1$, and $L_{11}$ are each independently selected from the group consisting of a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_4$-$C_{30}$ heteroarylene group, and $—N(Q_1)$-; n, m, a, and b are each independently an integer from 0 to 10; $R_1$ through $R_3$, $R_{11}$ through $R_{15}$, $R_{17}$, $R_{18}$, $R_{21}$ through $R_{29}$, $Ar_2$, $Ar_{12}$, and $Q_1$ are each independently selected from the group consisting of a hydrogen atom, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, a substituted or unsubstituted $C_4$-$C_{30}$ heteroaryl group, and $—N(Q_2)(Q_3)$; and $Q_2$ and $Q_3$ are each independently a hydrogen atom, a halogen atom, a hydroxyl group, a cyano group, a substituted or unsubstituted. $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, and a substituted or unsubstituted $C_4$-$C_{30}$ heteroaryl group, wherein n groups of $Ar_1$ in $—(Ar_1)_n—$ may be identical to or different from each other, m groups of $Ar_{11}$ in $—(Ar_{11})_m—$ may be identical to or different from each other, a groups of $L_1$ in $-(L_1)_a-$ may be identical to or different from each other, and b groups of $L_{11}$ in $-(L_{11})_b-$ may be identical to or different from each other.

The charge generating material may include a compound represented by Formula 3 below:

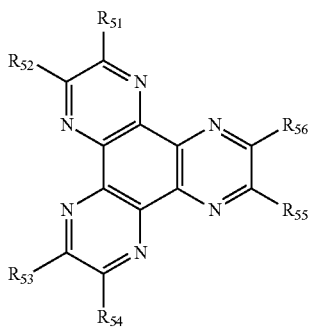

Formula 3

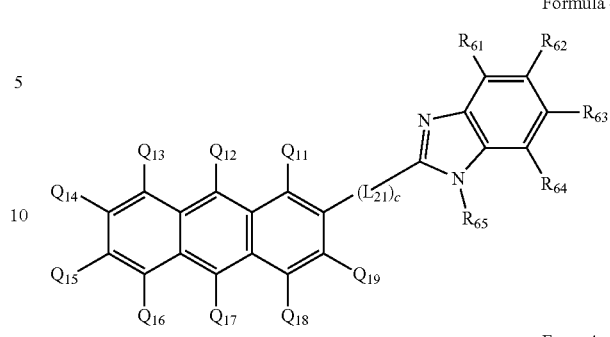

Formula 4 wherein, $R_{51}$ to $R_{56}$ are each independently selected from the group consisting of a hydrogen atom, —CN, —SOR$^{100}$, —SON(R$^{101}$)$_2$, —SO$_2$R$^{102}$, —SO$_2$N(R$^{103}$)$_2$, —SO$_3$R$^{104}$, —SO$_3$N(R$^{105}$)$_2$, —NO$_2$, —CFH$_2$, —CF$_2$H, and —CF$_3$, and $R^{100}$ to $R^{105}$ are each independently selected from the group consisting of a hydrogen atom, a substituted or unsubstituted $C_1$-$C_{30}$ alkyl group, a substituted or unsubstituted $C_5$-$C_{30}$ aryl group, and a substituted or unsubstituted $C_4$-$C_{30}$ heteroaryl group.

The thicknesses of the first hole transport layer, the third hole transport layer, and the fifth hole transport layer may be each independently in the range of about 0.1 nm to about 100 nm.

The thicknesses of the second hole transport layer and the fourth hole transport layer may be each independently in the range of about 0.01 nm to about 16 nm.

The amount of the charge generating material contained in the second hole transport layer may be in the range of about 0.01 to about 99 parts by weight based on 100 parts by weight of the second hole transport layer, and the amount of the charge generating material contained in the fourth hole transport layer may be in the range of about 0.01 to about 99 parts by weight based on 100 parts by weight of the fourth hole transport layer.

The third hole transport layer may include two charge generating material-containing layers, and the interface between the two charge generating material-containing layers is not clearly distinguished, so that the third hole transport layer is seen as a single layer.

The hole transport layer may include two hole transport units.

The electron transporting material contained in the electron transport layer may be selected from the group consisting of Compound 60 and compounds represented by Formulae 4 and 5 below:

Compound 60

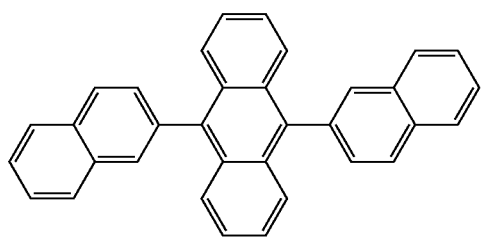

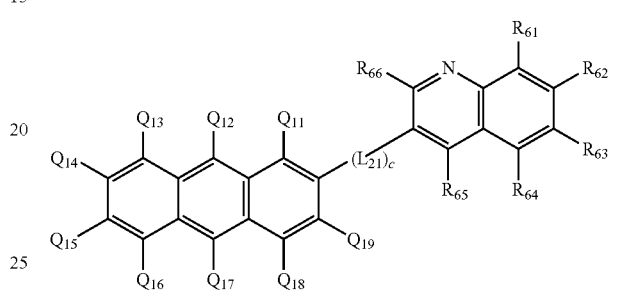

Formula 5 wherein $R_{61}$ to $R_{66}$ are each independently a hydrogen atom, a halogen atom, a hydroxy group, a cyano group, a substituted or unsubstituted. $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group, wherein at least two adjacent groups of $R_{61}$ to $R_{66}$ are selectively bonded to each other to form a saturated or unsaturated ring;

$L_{21}$ is a substituted or unsubstituted $C_1$-$C_{30}$ alkylene group, a substituted or unsubstituted $C_6$-$C_{30}$ arylene group, or a substituted or unsubstituted $C_3$-$C_{30}$ heteroarylene group;

$Q_{11}$ through $Q_{19}$ are each independently a hydrogen atom, a substituted or unsubstituted $C_6$-$C_{30}$ aryl group, or a substituted or unsubstituted $C_3$-$C_{30}$ heteroaryl group; and c is an integer from 0 to 10.

The metal-containing material contained in the electron transport layer may include a Li complex.

The electron transport layer may include at least one electron transport unit including: a first electron transport layer including the electron transporting material; a third electron transport layer formed on the first electron transport layer and including the metal-containing material; and a fifth electron transport layer formed on the third electron transport layer and including the electron transporting material.

The electron transport unit may further include at least one layer selected from the group consisting of a second electron transport layer interposed between the first electron transport layer and the third electron transport layer and including the electron transporting material and the metal-containing material, and a fourth electron transport layer interposed between the third electron transport layer and the fifth electron transport layer and including the electron transporting material and the metal-containing material.

The third electron transport layer may include two metal-containing material-containing layers, and the interface between the two metal-containing material-containing layers is not clearly distinguished, so that the third electron transport layer is seen as a single layer.

The electron transport layer may include two electron transport units.

According to one or more embodiments of the present invention, a method of manufacturing an organic light-emitting device includes:

forming a first electrode on a substrate;

forming a hole transport layer on the first electrode;

forming an emission layer on the hole transport layer;

forming an electron transport layer including an electron transporting material and a metal-containing material on the emission layer; and forming a second electrode on the electron transport layer, wherein the forming the hole transport layer includes:

preparing a first deposition source releasing a hole transporting material and a second deposition source releasing a charge generating material;

disposing an anti-deposition plate between the first deposition source and the second deposition source; and forming a hole transport layer including at least one hole transport unit including: a first hole transport layer including the hole transporting material; a third hole transport layer formed on the first hole transport layer and including the charge generating material; and a fifth hole transport layer formed on the third hole transport layer and including the hole transporting material, by performing at least one reciprocation of the first deposition source and the second deposition source from a first end to a second end, and then the second end to the first end of a region in which the hole transport layer is formed, or preparing a first deposition source releasing a hole transporting material and a second deposition source releasing a charge generating material;

disposing the first deposition source and the second deposition source to be spaced apart from each other such that a region to which the hole transporting material is released overlaps a region to which the charge generating material is released; and forming a hole transport layer including at least one hole transport unit including: a first hole transport layer including the hole transporting material; a third hole transport layer formed on the first hole transport layer and including the charge generating material; and a fifth hole transport layer formed on the third hole transport layer and including the hole transporting material, and at least one layer selected from the group consisting of a second hole transport layer interposed between the first hole transport layer and the third hole transport layer and including the hole transporting material and the charge generating material, and a fourth hole transport layer interposed between the third hole transport layer and the fifth hole transport layer and including the hole transporting material and the charge generating material, by performing at least one reciprocation of the first deposition source and the second deposition source from a first end to a second end, and then the second end to the first end of a region in which the hole transport layer is formed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
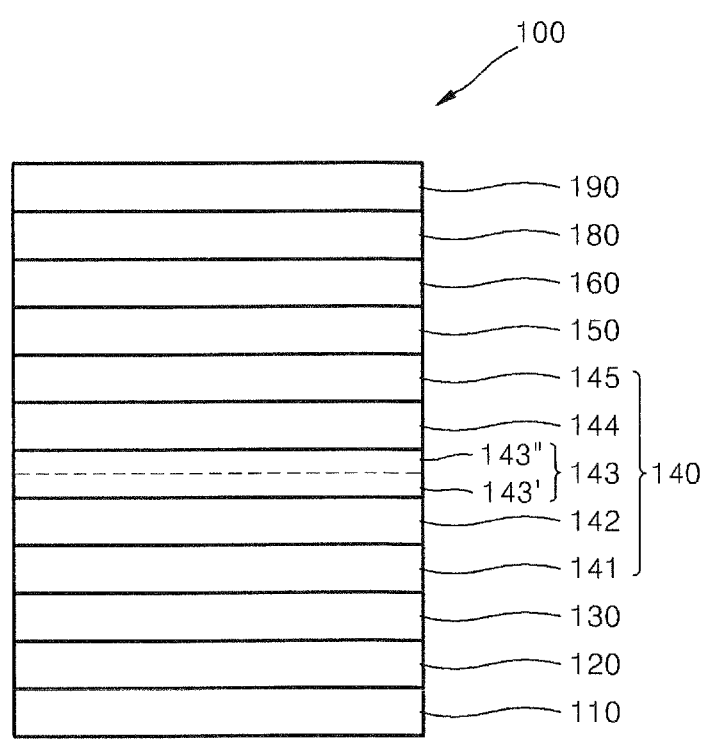
FIG. 1 is a schematic cross-sectional view of an organic light-emitting device (OLED) according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In the specification and the claim section, the expression "An A layer is formed on a B layer (or the surface of a B layer)" is used to describe a structure in which the A layer is formed to cover at least a part of the B layer (or the surface of the B layer). It will be understood when the expression of "An A layer is formed on a B layer (or the surface of a B layer)" is used, or when an element such as a layer, film, region, or substrate is referred to as being "on" another element, the layer or the element can be formed directly on the another element, or one or more intervening elements may also be present. The structure would have been obvious to those of ordinary skill in the art. In the specification and the claim section, when a chemical formula of $(X)_n$ or a similar formula is used, it will be understood that n groups of X in the formula $(X)_n$ may be identical to or different from each other unless otherwise stated.

FIG. 1 is a schematic sectional view of an organic light-emitting device (OLED) 100 according to an embodiment of the present invention.

Referring to FIG. 1, the OLED 100 according to the current embodiment of the present invention includes a substrate 110, and a first electrode 120, a hole injection layer (HIL) 130, a hole transport layer (HTL) 140, an emission layer (EML) 150, an electron transport layer (ETL) 160, an electron injection layer (EIL) 180, and a second electrode 190 which are sequentially stacked on the substrate 110 in the stated order. The HTL 140 includes one hole transport unit including: a first HTL 141 having a hole transporting material; a second HTL 142 formed on the first HTL 141 and having the hole transporting material and a charge generating material; a third HTL 143 formed on the second HTL 142 and having the charge generating material; a fourth HTL 144 formed on the third HTL 143 and having the hole transporting material and the charge generating material; and a fifth HTL 145 formed on the fourth HTL 144 and having the hole transporting material.

The substrate 110, which may be any substrate that is generally used in organic light-emitting devices, may be a glass substrate or a transparent plastic substrate with excellent mechanical strength, thermal stability, transparency, surface smoothness, ease of handling, and waterproofness.

The first electrode 120 is formed on the substrate 110. The first electrode 120 may be formed by depositing or sputtering a material used to form the first electrode 120 on the substrate 110. The first electrode 120 may be an anode. When the first electrode 120 constitutes an anode, the material used to form the first electrode 120 may be a high work-function material so as to facilitate hole injection. The first electrode 120 may be a transmissive electrode or a semi-transmissive electrode. Transparent and conductive materials such as ITO, IZO, $SnO_2$, and ZnO may be used to form the first electrode 120. The first electrode 120 may be formed as a semi-transmissive electrode using magnesium (Mg), aluminum (Al), aluminum-lithium (Al—Li), calcium (Ca), magnesium-indium (Mg—In), magnesium-silver (Mg—Ag), or the like.

The HIL 130 may be disposed on the first electrode 120. The HIL 130 may be formed on the first electrode 120 by vacuum deposition, spin coating, casting, LB deposition, or the like.

When the HIL 130 is formed using vacuum deposition, the deposition conditions may vary according to a compound that is used to form the HIL 130, and the structure and thermal properties of the HIL 130 to be formed. In general, however, conditions for vacuum deposition may include a deposition temperature of about 100 to about 500° C., a pressure of about $10^{-8}$ to about $10^{-3}$ torr, and a deposition rate of about 0.01 to about 100 Å/sec.

When the HIL 130 is formed using spin coating, the coating conditions may vary according to a compound that is used to form the HIL 130, and the structure and thermal properties of the HIL 130 to be formed. In general, however, the coating rate may be in the range of about 2000 to about 5000 rpm, and a temperature for heat treatment which is performed to remove a solvent after coating may be in the range of about 80 to about 200° C.

The HIL 130 may be formed of any material that is commonly used to form a HIL. Examples of the material that may be used to form the HIL 130 include, but are not limited to, a phthalocyanine compound such as copperphthalocyanine, 4,4',4"-tris (3-methylphenylphenylamino) triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBS A), poly(3,4-ethylenedioxythiophene)/poly(4-styrenesulfonate) (PEDOT/PSS), polyaniline/camphor sulfonicacid (PANI/CSA), and polyaniline)/poly(4-styrenesulfonate) (PANI/PSS).

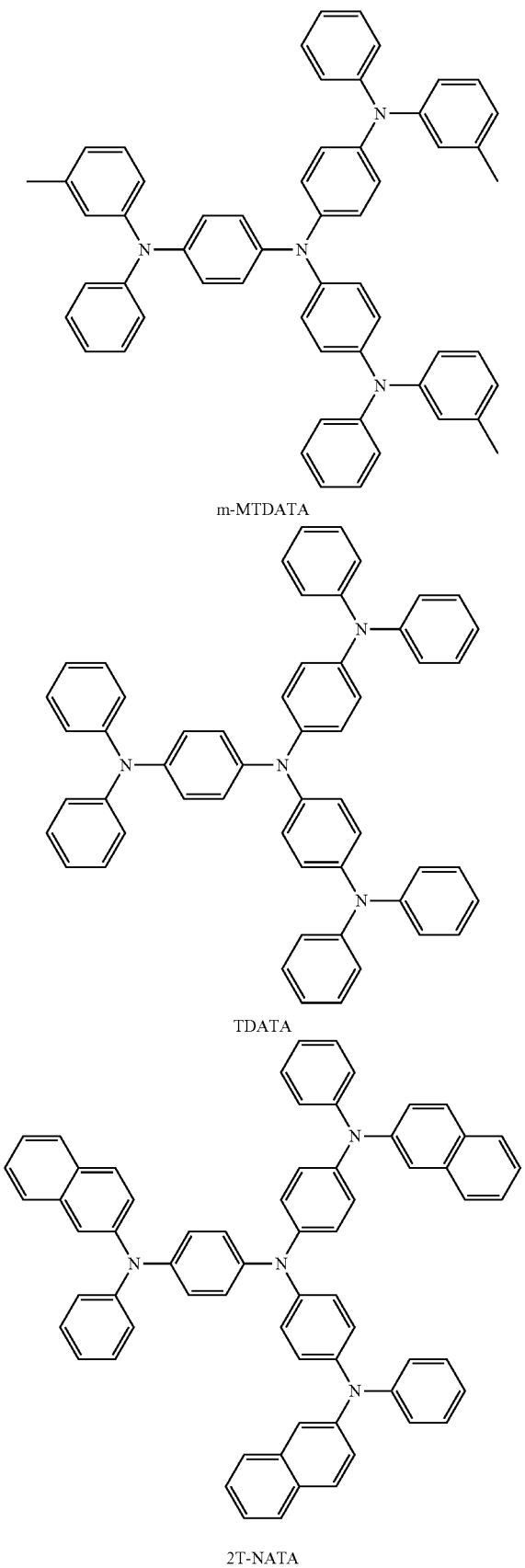

m-MTDATA

TDATA

2T-NATA

The thickness of the HIL 130 may be in the range of about 100 to about 10,000 Å, for example, about 100 to about 1000 Å. When the thickness of the HIL 130 is within this range of about 100 to about 10,000 Å, the HIL 130 may have excellent hole injecting ability without a substantial increase in driving voltage.

The HTL 140 is disposed on the HIL 130. The HTL 140 includes the hole transport unit including: the first HTL 141 having a hole transporting material; the second HTL 142 formed on the first HTL 141 and having the hole transporting material and a charge generating material; the third HTL 143 formed on the second HTL 142 and having the charge generating material; the fourth HTL 144 formed on the third HTL 143 and having the hole transporting material and the charge generating material; and the fifth HTL 145 formed on the fourth HTL 144 and having the hole transporting material.

The HTL 140 has a structure in which the second HTL 142, the third HTL 143, the fourth HTL 144, and the fifth HTL 145 are sequentially stacked on the first HTL 141 in the order stated, so that injection and transport of holes may be controlled and electrons may be blocked. In the OLED 100, the number of excitons generated in emission regions may be gradually reduced since the amount of electrons or holes may change with time during the operation of the OLED 100. As a result, a carrier balance may not be maintained, and thus, the lifetime of the OLED 100 may be reduced. However, since the HTL 140 has a stack structure of a plurality of layers with a similar or same energy level (the first HTL 141, the second HTL 142, the third HTL 143, the fourth HTL 144, and the fifth HTL 145), the flow of carriers may be constantly maintained while controlling migration rates of holes. Thus, lifetime characteristics of the OLED 100 may be improved.

The hole transporting material may be represented by one selected from the group consisting of Formulae 1 and 2 below.

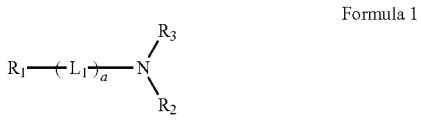

Formula 1

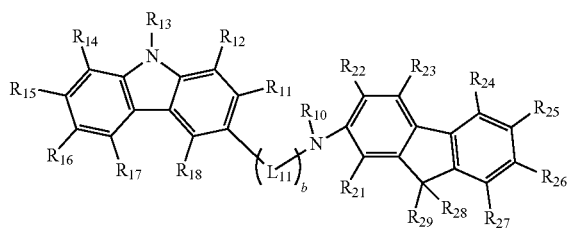

Formula 2

In Formulae 1 and 2, $R_{10}$ is represented by —$(Ar_1)_n$—$Ar_2$; $R_{16}$ is represented by —$(Ar_{11})_m$—$Ar_{12}$; $Ar_1$, $Ar_{11}$, $L_1$, and $L_{11}$ are each independently selected from the group consisting of a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_4$-$C_{30}$ heteroarylene group, and —$N(Q_1)$-; n, m, a, and b are each independently an integer from 0 to 10; $R_1$ through $R_3$, $R_{11}$ through $R_{15}$, $R_{17}$, $R_{18}$, $R_{21}$ through $R_{29}$, $Ar_2$, $Ar_{12}$, and $Q_1$ are each independently selected from the group consisting of a hydrogen atom, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, a substituted or unsubstituted $C_4$-$C_{30}$ heteroaryl group, and —$N(Q_2)(Q_3)$; and $Q_2$ and $Q_3$ are each independently a hydrogen atom, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, and a substituted or unsubstituted $C_4$-$C_{30}$ heteroaryl group, wherein n groups of $Ar_1$ in —$(Ar_1)_n$— may be identical to or different from each other, m groups of $Ar_{11}$ in —$(Ar_{11})_m$— may be identical to or different from each other, a groups of $L_1$ in -$(L_1)_a$- may be identical to or different from each other, and b groups of $L_{11}$ in -$(L_{11})_b$- may be identical to or different from each other.

Examples of $Ar_1$ in the formula —$(Ar_1)_n$—$Ar_2$— for $R_{10}$ and $Ar_{11}$ in the formula —$(Ar_{11})_m$—$Ar_{12}$— for $R_{16}$ include a substituted or unsubstituted $C_1$-$C_{10}$ alkylene group, a substituted or unsubstituted $C_2$-$C_{10}$ alkenylene group, a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinyl en e group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, a substituted or unsubstituted triazinylene group, and a group represented by —N($Q_1$)-, but are not limited thereto. In this regard, $Q_1$ may be selected from the group consisting of a hydrogen atom, a halogen atom, a hydroxyl group, a cyano group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_1$-$C_{10}$ alkylthiol group, a substituted or unsubstituted $C_5$-$C_{14}$ aryl group, a substituted or unsubstituted $C_4$-$C_{14}$ heteroaryl group, and —N($Q_2$)($Q_3$), but is not limited thereto.

For example, $Ar_1$ and $Ar_{11}$ may be each independently selected from the group consisting of a $C_1$-$C_{10}$ alkylene group; a phenylene group; a naphthylene group; an anthrylene group; a fluorenylene group; a carbazolylene group; a pyrazolylene group; a pyridinylene group; a triazinylene group; —N($Q_1$)-; and a substituted $C_1$-$C_{10}$ alkylene group, a substituted phenylene group, a substituted naphthylene group, a substituted anthrylene group, a substituted fluorenylene group, a substituted carbazolylene group, a substituted pyrazolylene group, a substituted pyridinylene group, and a substituted triazinylene group which have at least one substituent selected from the group consisting of a halogen atom, a cyano group, a hydroxyl group, a $C_1$-$C_{10}$ alkyl group, a $C_1$-$C_{10}$ alkoxy group, a phenyl group, a naphthyl group, and an anthryl group, but are not limited thereto. In this regard, $Q_1$ may be selected from the group consisting of a hydrogen atom; a $C_1$-$C_{10}$ alkyl group; a phenyl group; a naphthyl group; a carbazolyl group; a fluorenyl group; a pyrenyl group; a substituted $C_1$-$C_{10}$ alkyl group, a substituted $C_1$-$C_{10}$ alkoxy group, a substituted phenyl group, a substituted naphthyl group, a substituted carbazolyl group, a substituted fluorenyl group, and a substituted pyrenyl group which have at least one substituent selected from the group consisting of a halogen atom, a cyano group, a hydroxyl group, a $C_1$-$C_{10}$ alkyl group, a $C_1$-$C_{10}$ alkoxy group, a phenyl group, a naphthyl group, and an anthryl group; and —N($Q_2$)($Q_3$), but is not limited thereto. In this regard, $Q_2$ and $Q_3$ may be selected from the group consisting of a methyl group, a phenyl group, a naphthyl group, and an anthryl group.

$Ar_2$ in the formula —($Ar_1$)$_n$—$Ar_2$— and $Ar_{12}$ in the formula —($Ar_{11}$)$_m$—$Ar_{12}$- are as defined above in connection with $Q_1$.

n in the formula —($Ar_1$)$_n$—$Ar_2$— and m in the formula —($Ar_{11}$)$_m$—$Ar_{12}$— are each independently an integer from 0 to 10. For example, n and m may be each independently 0, 1, 2, 3, 4, or 5, but are not limited thereto.

n groups of $Ar_1$ in the formula —($Ar_1$)$_n$—$Ar_2$— may be identical to or different from each other. For example, when n is 2, the two groups of $Ar_1$ in —($Ar_1$)$_n$— may be both phenylene groups, or one of the two may be —N($Q_1$)- and the other may be a phenylene group, and various modifications may be applied thereto. The descriptions of —($Ar_{11}$)$_m$—$Ar_{12}$— may be the same as those of —($Ar_1$)$_n$—$Ar_2$— above.

$R_1$ through $R_3$, $R_{11}$ through $R_{15}$, $R_{17}$, $R_{18}$, and $R_{21}$ through $R_{29}$ in Formulae 1 and 2 may be defined as described above in connection with $Q_1$.

For example, $R_{13}$ may be a phenyl group, a naphthyl group, or an anthryl group, but is not limited thereto.

For example, $R_{28}$ and $R_{29}$ may be each independently selected from the group consisting of a hydrogen atom, a methyl group, an ethyl group, a methoxy group, an ethoxy group, a phenyl group, a naphthyl group, and an anthryl group, but are not limited thereto.

$L_1$ and $L_2$ in Formulae 1 and 2 are defined as described above in connection with $Ar_1$ and $Ar_{11}$.

For example, $L_1$ and $L_2$ may be each independently a phenylene group, a carbazolylene group, or a phenylcarbazolylene group, but are not limited thereto.

In Formulae 1 and 2, a and b may be each independently an integer from 0 to 10. For example, a and b may be each independently 0, 1, 2 or 3, but are not limited thereto.

For example, in Formula 2, $Ar_1$ in the formula —($Ar_1$)$_n$—$Ar_2$— for $R_{10}$ and $Ar_{11}$ in the formula —($Ar_{11}$)$_m$—$Ar_{12}$— for $R_{16}$ may be each independently selected from the group consisting of a phenylene group; a carbazolylene group; a fluorenylene group; a methylfluorenylene group; a pyrazolylene group; a phenylpyrazolylene group; —N($Q_1$)-, wherein $Q_1$ is a hydrogen atom, a phenyl group, a fluorenyl group, a dimethylfluorenyl group, a diphenylfluorenyl group, a carbazolyl group, or a phenylcarbazolyl group; a diphenylfluorenylene group; a triazinylene group; a methyltriazinylene group; a phenyltriazinylene group; a tetrafluorophenylene group; an ethylene group; and a methylphenylene group, wherein n and m may be each independently 0, 1, 2, 3, 4, 5 or 6, and $Ar_2$ and $Ar_{12}$ may be each independently selected from the group consisting of a hydrogen atom, a cyano group, a fluoro group, a phenyl group, a cyanophenyl group, a naphthyl group, an anthryl group, a methyl group, a pyridinyl group, a carbazolyl group, a phenylcarbazolyl group, a fluorenyl group, a dimethylfluorenyl group, and a diphenylfluorenyl group. $R_{11}$, $R_{12}$, $R_{14}$, $R_{15}$, $R_{17}$, $R_{18}$, and $R_{21}$ through $R_{27}$ may be hydrogen; $R_{13}$ may be selected from the group consisting of a phenyl group, a naphthyl group, and an anthryl group; $R_{28}$ and $R_{29}$ may be each independently selected from the group consisting of a hydrogen atom, a methyl group, an ethyl group, a methoxy group, an ethoxy group, a phenyl group, a naphthyl group, and an anthryl group; $L_{11}$ may be a phenylene group; and b may be 0 or 1.

In an embodiment of the present invention, the hole transporting material may be any one of the Compounds 1 through 37 below, but is not limited thereto.

13 14
1
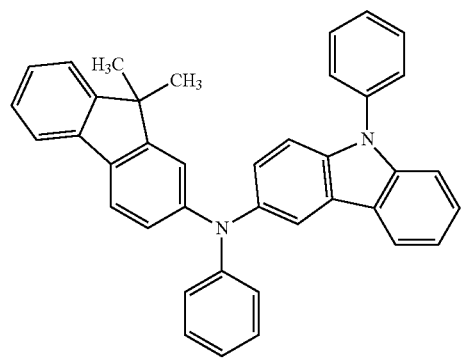
2
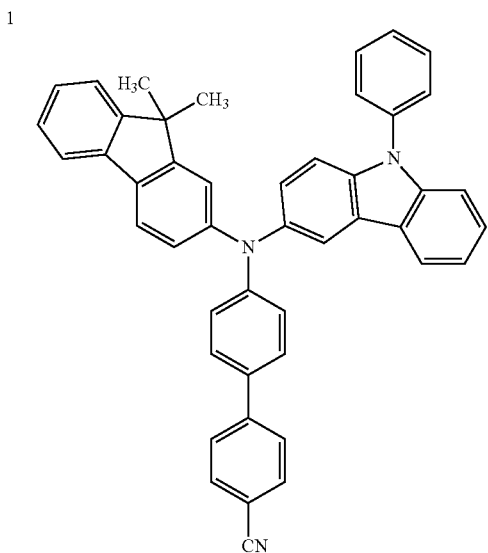
3
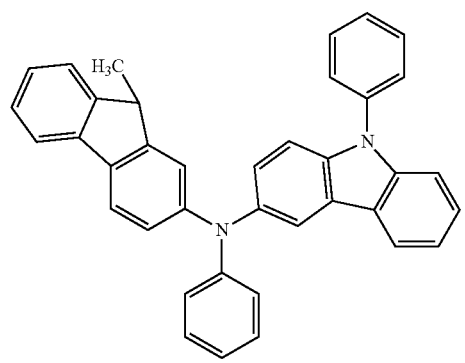
4
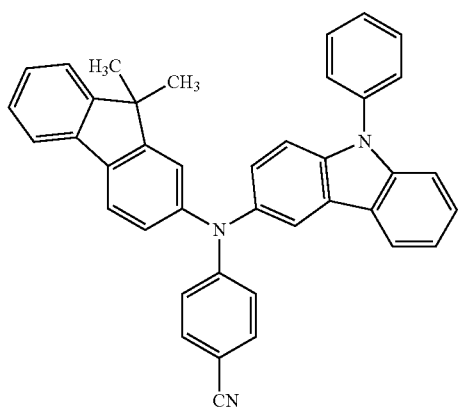
5
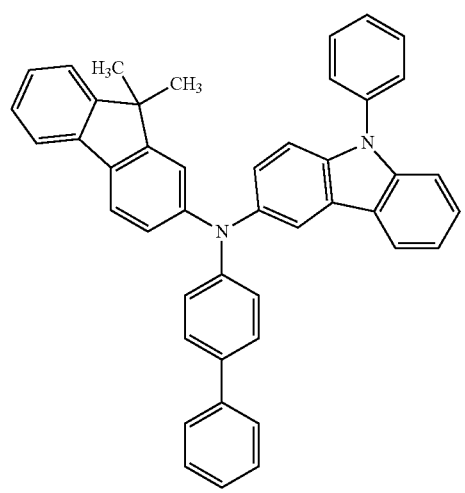
6
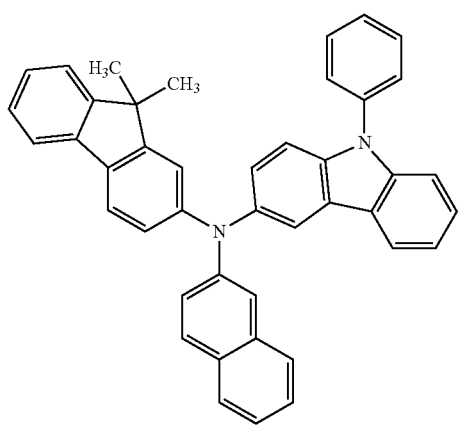

-continued
7
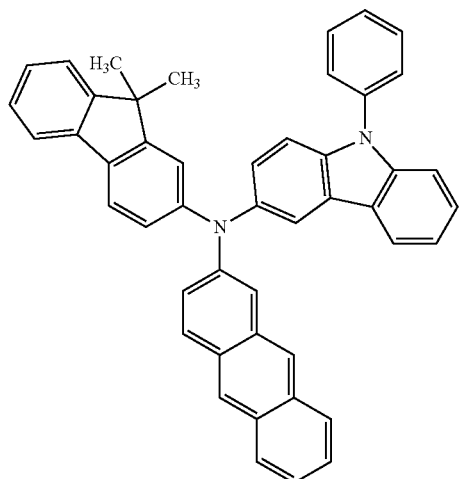
8
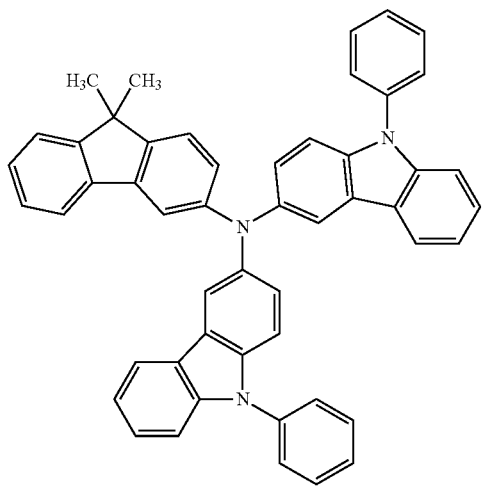
9
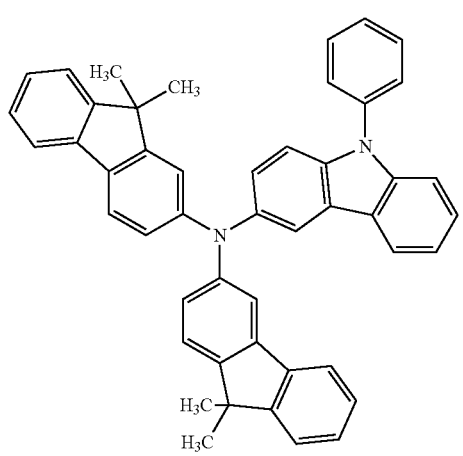
10
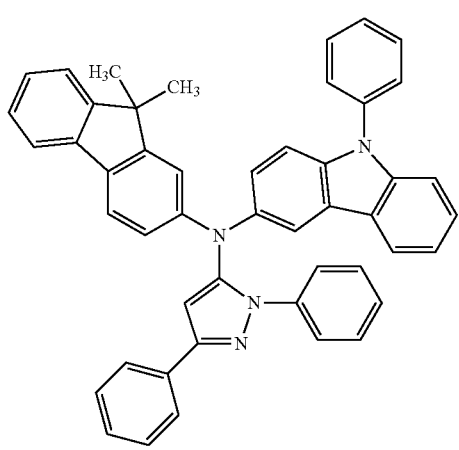
11
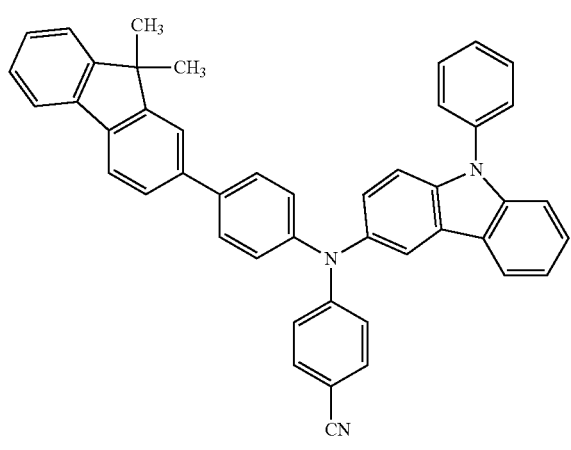
12
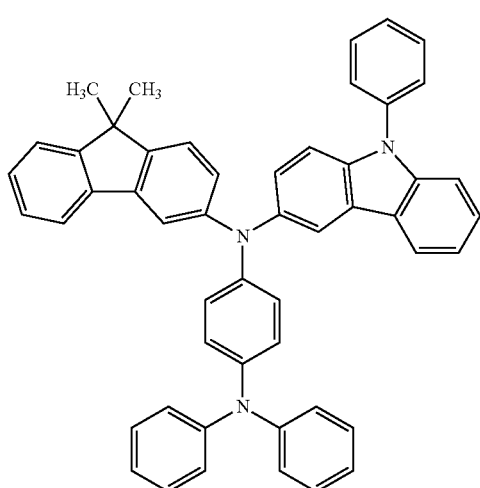

-continued
13
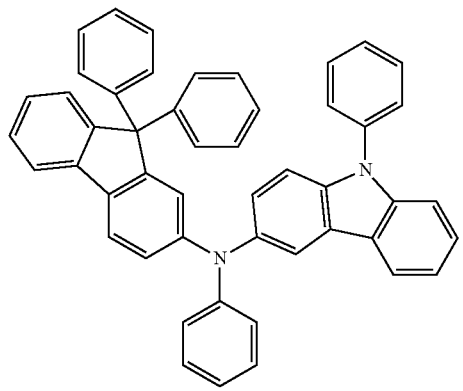
14
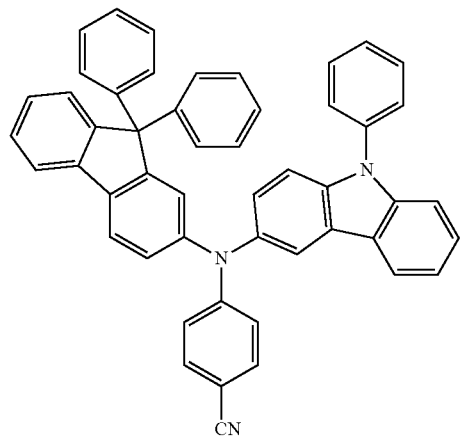
15
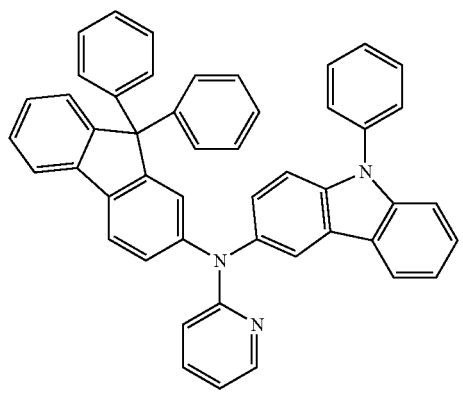
16
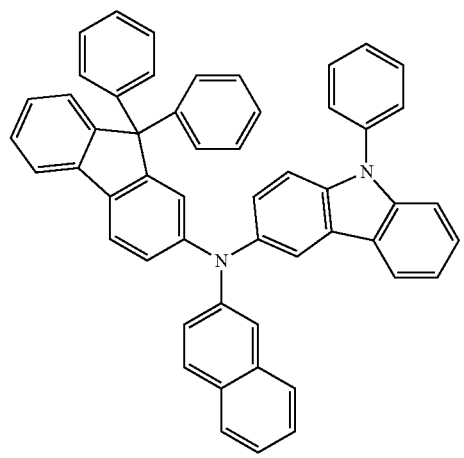
17
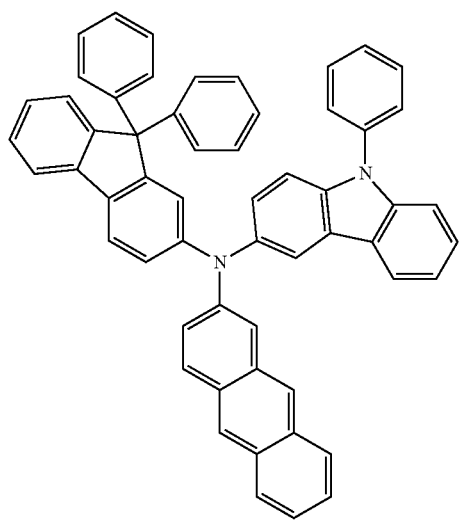
18
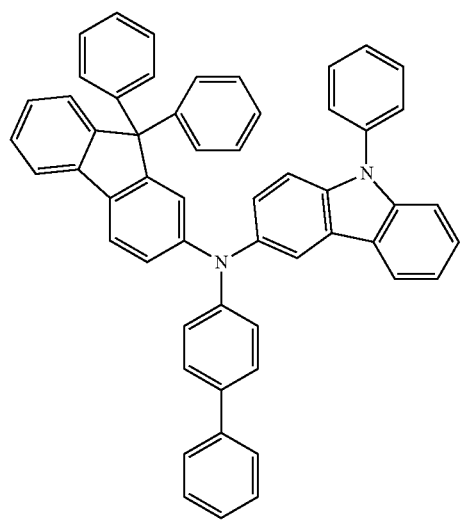

-continued
19
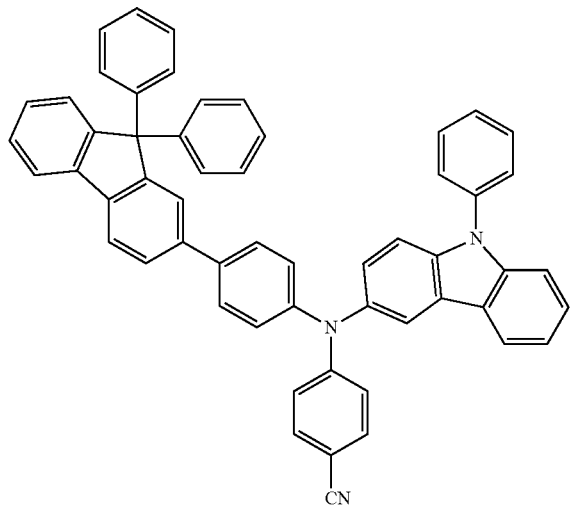
20
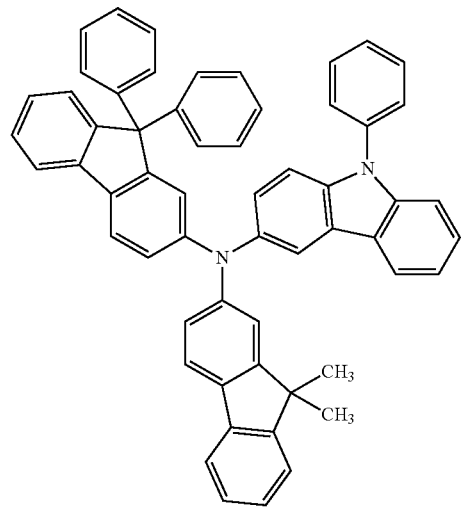
21
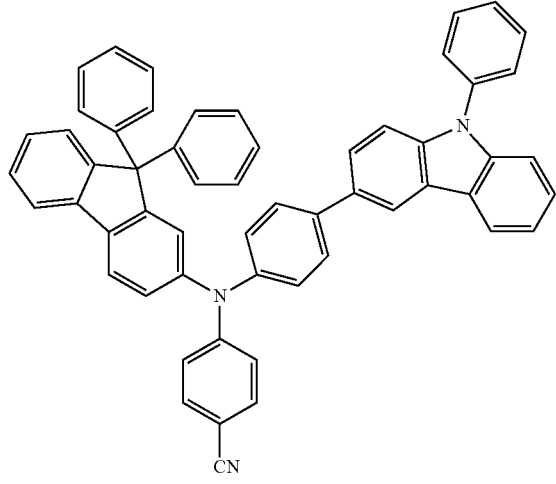
22
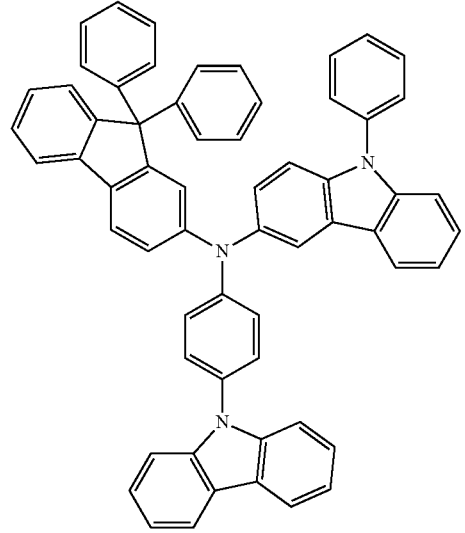

23
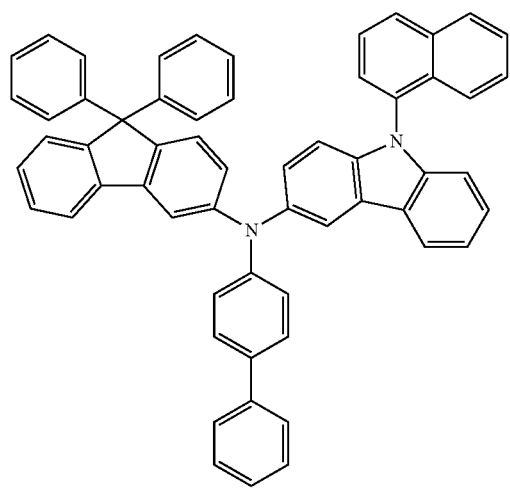
24
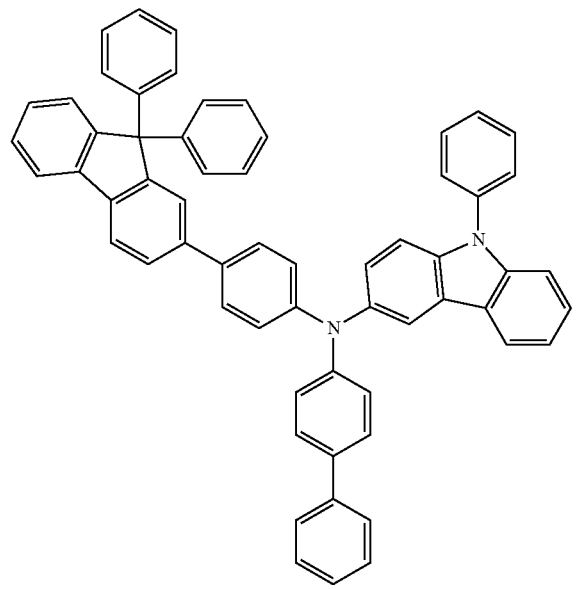
25
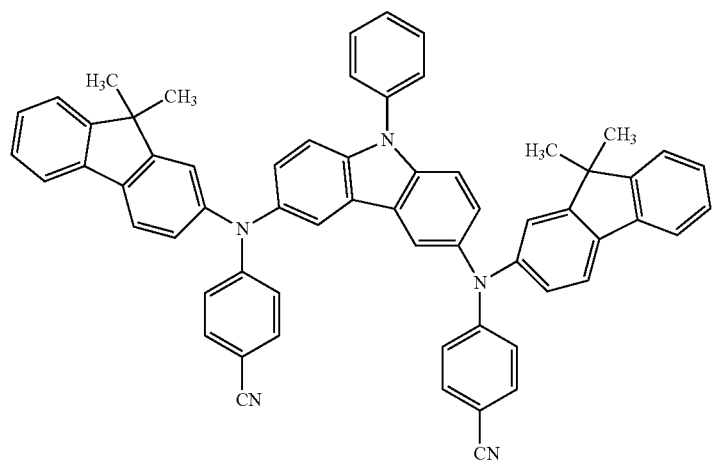
26
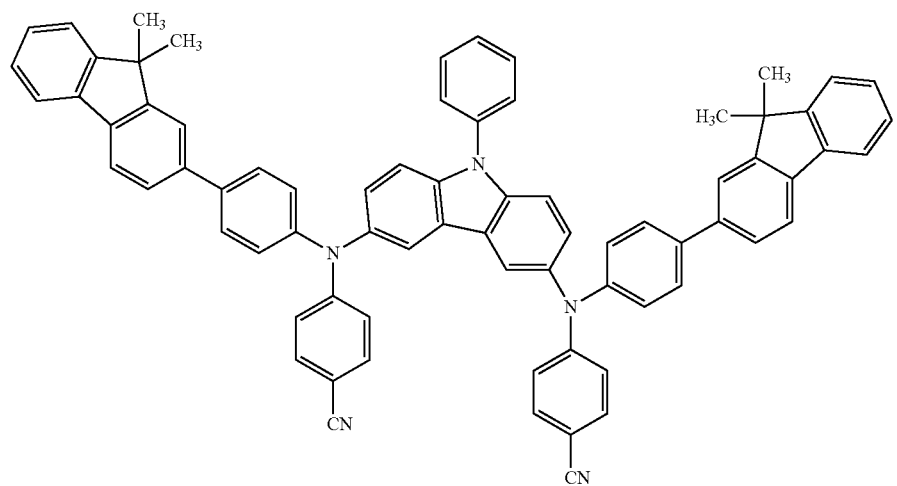

27
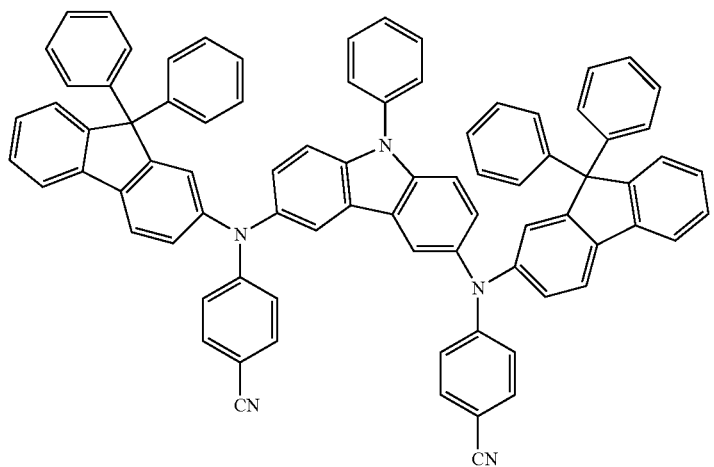
28
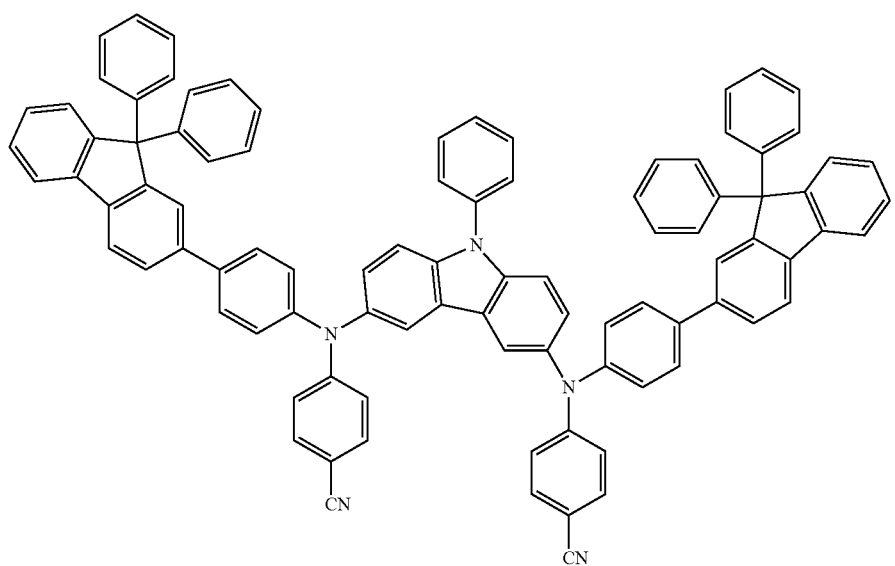
29
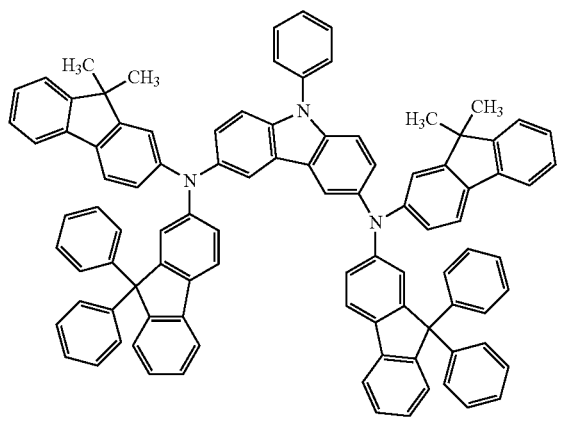
30
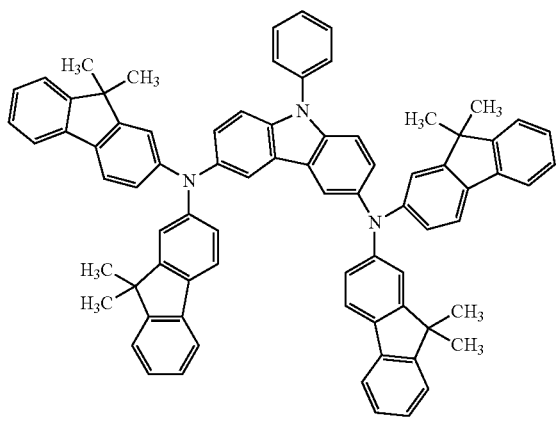

-continued
31 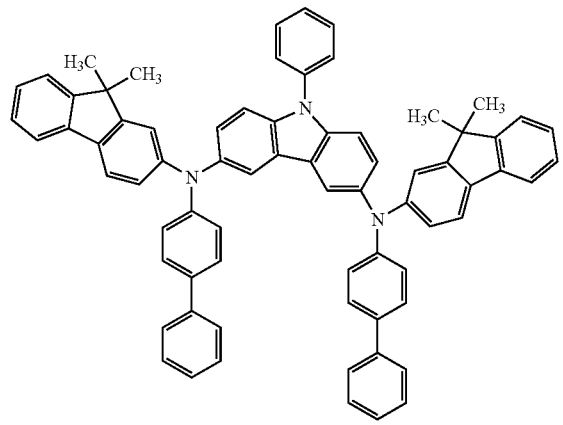
32 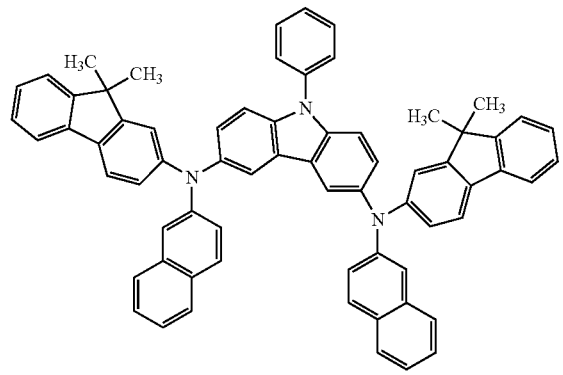
33 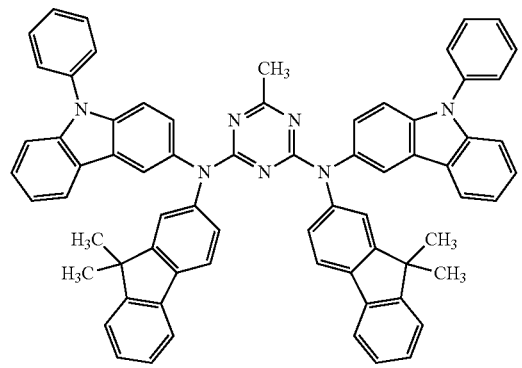
34 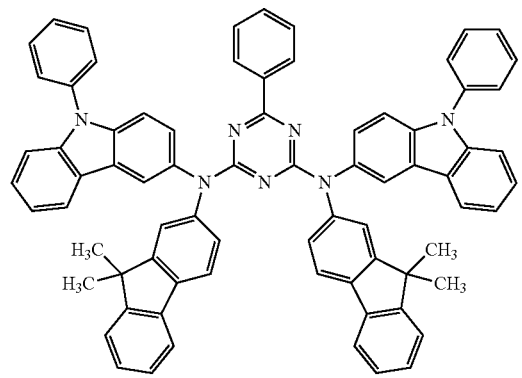
35 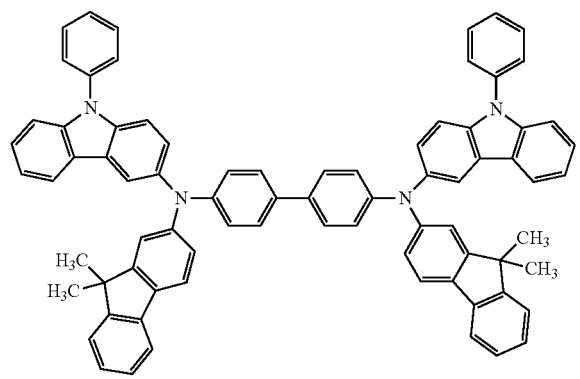
36 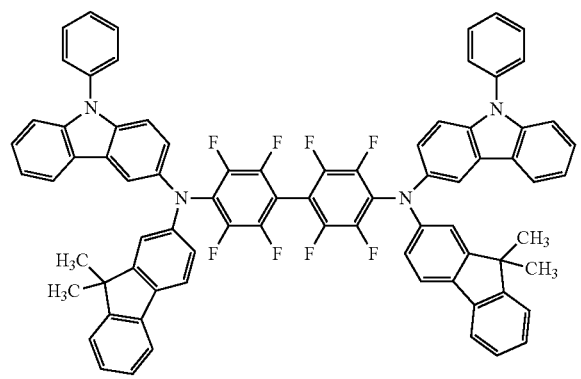

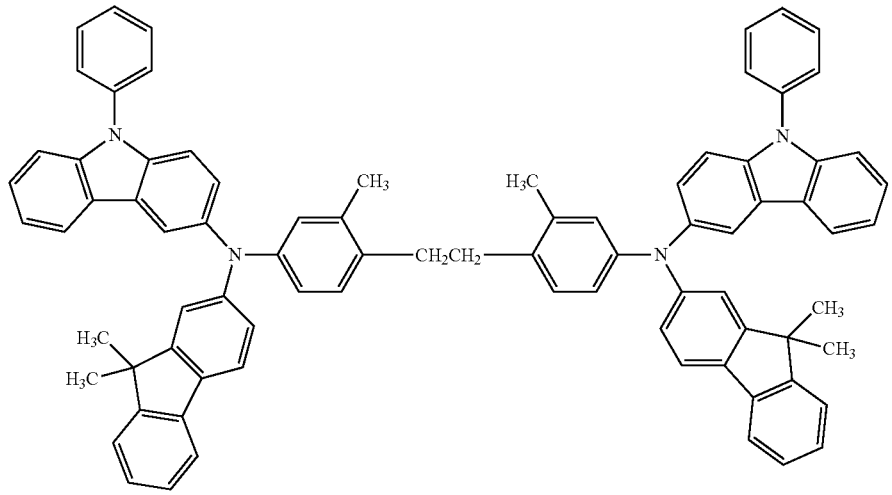

The charge generating material is material generating charge carriers (i.e., holes and/or electrons) upon exposure to light. The charge generating material may include a compound represented by Formula 3 below.

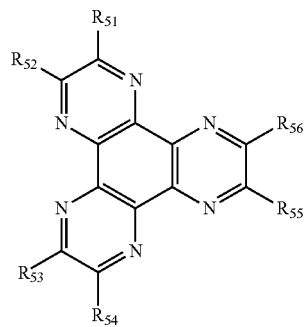

Formula 3

In Formula 3, $R_{51}$ to $R_{56}$ are each independently selected from the group consisting of a hydrogen atom, —CN, —SOR$^{100}$, —SON(R$^{101}$)$_2$, —SO$_2$R$^{102}$, —SO$_2$N(R$^{103}$)$_2$, —SO$_3$R$^{104}$, —SO$_3$N(R$^{105}$)$_2$, —NO$_2$, —CFH$_2$, —CF$_2$H, and —CF$_3$, and R$^{100}$ to R$^{105}$ are each independently selected from the group consisting of a hydrogen atom, a substituted or unsubstituted $C_1$-$C_{30}$ alkyl group, a substituted or unsubstituted $C_5$-$C_{30}$ aryl group, and a substituted or unsubstituted $C_4$-$C_{30}$ heteroaryl group.

For example, R$^{100}$ through R$^{105}$ may be each independently selected from the group consisting of a hydrogen atom, a substituted or unsubstituted $C_1$-$C_{10}$ alkyl group, a substituted or unsubstituted $C_5$-$C_{14}$ aryl group, and a substituted or unsubstituted $C_4$-$C_{14}$ heteroaryl group.

For example, R$^{100}$ to R$^{105}$ may be each independently selected from the group consisting of a hydrogen atom, a methyl group, an ethyl group, a propyl group, a butyl group, a pentyl group, a methyl group substituted with at least one —CN group, an ethyl group substituted with at least one —CN group, a propyl group substituted with at least one —CN, a butyl group substituted with at least one —CN, a pentyl group substituted with at least one —CN, a phenyl group, a naphthyl group, an anthryl group, a fluorenyl group, a phenyl group substituted with at least one —CN, a naphthyl group substituted with at least one —CN, an anthryl group substituted with at least one —CN, a fluorenyl group substituted with at least one —CN, a carbazolyl group, a quinolinyl group, an imidazolyl group, a carbazolyl group substituted with at least one —CN, a quinolinyl group substituted with at least one —CN, and an imidazolyl group substituted with at least one —CN, but are not limited thereto.

For example, the charge generating material may be Compound 40 below, but is not limited thereto.

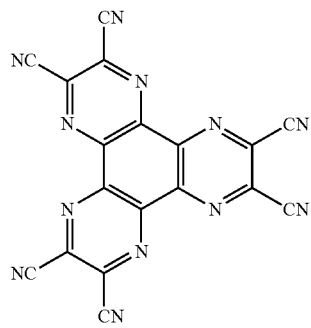

Compound 40

The thicknesses of the first HTL 141, the third HTL 143, and the fifth HTL 145 may be each independently in the range of about 0.1 nm to about 100 nm. For example, the thicknesses of the first HTL 141 and the fifth HTL 145 may be each independently in the range of about 10 nm to about 100 nm, for example, about 50 mn to about 60 nm, but are not limited thereto. For example, the thickness of the third HTL 143 may be in the range of about 0.5 nm to about 100 nm, for example, about 0.5 nm to about 10 nm, but is not limited thereto.

When the thicknesses of the first HTL 141, the third HTL 143, and the fifth HTL 145 are within this range of about 0.1 nm to about 100 nm, holes may be effectively injected and transported to the EML 150 without a substantial increase in driving voltage. The thicknesses of the first HTL 141, the third HTL 143, and the fifth HTL 145 may be the same or different.

The thicknesses of the second HTL 142 and the fourth HTL 144 may be each independently in the range of about 0.01 nm to about 16 nm, for example, about 0.5 nm to about 1 nm. When the thicknesses of the second HTL 142 and the fourth HTL 144 are within this range of about 0.01 nm to about 16 nm, holes may be effectively injected and transported to the EML 150 without a substantial increase in driving voltage. The thicknesses of the second HTL 142 and the fourth HTL 144 may be the same or different.

The amount of the charge generating material contained in the second HTL 142 may be in the range of about 0.01 to about 99 parts by weight, for example, about 45 to about 55 parts by weight based on 100 parts by weight of the second HTL 142. The amount of the charge generating material contained in the fourth. HTL 144 may be in the range of about 0.01 to about 99 parts by weight, for example, about 45 to about 55 parts by weight based on 100 parts by weight of the fourth HTL 144. When the amount of the charge generating material contained in the second HTL 142 and the fourth HTL 144 is within the range of about 0.01 to about 99 parts by weight, the efficiency of OLED 100 may be improved.

The HTL 140 may be formed by using vacuum deposition, spin coating, casting, or the like. When the HTL 140 is formed using vacuum deposition or spin coating, the deposition and coating conditions may be similar to those for the formation of the HIL 130, though the deposition and coating conditions may vary according to the material that is used to form the HTL 140.

Using vacuum deposition, the HTL 140 may be formed by preparing a first deposition source releasing the hole transporting material and a second deposition source releasing the charge generating material, disposing the first deposition source and the second deposition source to be spaced apart from each other such that a region to which the hole transporting material is released overlaps a region to which the charge generating material is released, and performing one reciprocation of the first and second deposition sources from a first end to a second end, and then from the second end to the first end of a region on which the HTL 140 will be formed on the HIL 130 in FIG. 1.

FIGS. 5A to 5G schematically illustrate a method of forming a HTL 140 on the HIL 130, according to an embodiment of the present invention. Although the substrate 110 and the first electrode 120 are disposed at one surface of the HIL 130 on which the HTL 140 is not formed, they are not shown in FIGS. 5A to 5G for descriptive convenience.

Figure 5A:
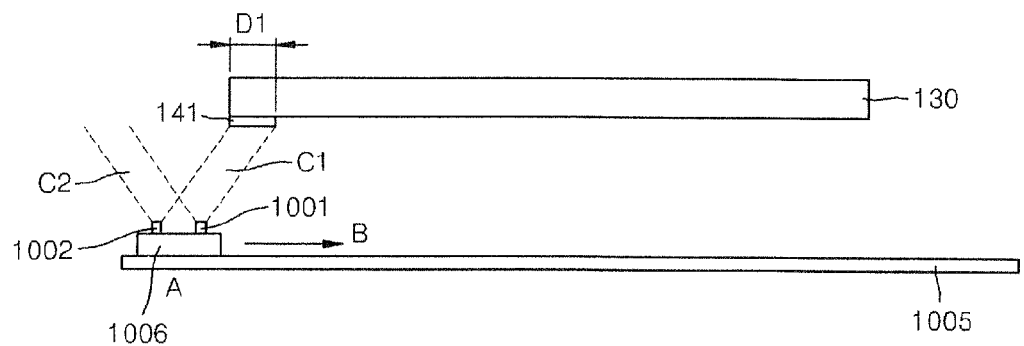
FIGS. 5A to 5G schematically illustrate a method of forming a hole transport layer of the OLED of FIG. 1, according to an embodiment of the present invention.

Referring to FIG. 5A, a first deposition source 1001 and a second deposition source 1002 may be disposed below one surface of the HIL 130, i.e., the surface on which the substrate 110 and the first electrode 120 are not formed. The first deposition source 1001 may be a deposition source releasing the hole transporting material, and the second deposition source 1002 may be a deposition source releasing the charge generating material. As shown in FIG. 5A, a region C1 to which the hole transporting material is released by the first deposition source 1001 and a region C2 to which the charge generating material is released by the second deposition source 1002 may have a fan shape with a predetermined angle.

Meanwhile, the first deposition source 1001 and the second deposition source 1002 are disposed to be spaced apart from each other such that the region C1 to which the hole transporting material is released overlaps the region C2 to which the charge generating material is released. Accordingly, the hole transporting material and the charge generating material may be simultaneously deposited to form the second HTL 142 and the fourth HTL 144 including both of the hole transporting material and the charge generating material as shown in FIGS. 5B and 5F.

The first deposition source 1001 and the second deposition source 1002 may be mounted on a base 1006 that is disposed on a guide rail 1005 that is disposed in a chamber and reciprocates along the guide rail 1005. The base 1006 may be connected to a separate drive unit (not shown) to operate.

As described above, the base 1006 on which the first deposition source 1001 and the second deposition source 1002 are mounted to be spaced apart from each other by a predetermined distance may move in the B direction from a first end A below the HIL 130 when the first deposition source 1001 and the second deposition source 1002 are in an "on" state as shown in FIG. 5A. In this regard, only the hole transporting material is deposited on the HIL 130 to form the first HTL 141 including the hole transporting material (D1). The first HTL 141 is continuously deposited toward a second end E below the HIL 130 as the base 1006 moves in the B direction.

Figure 5B:
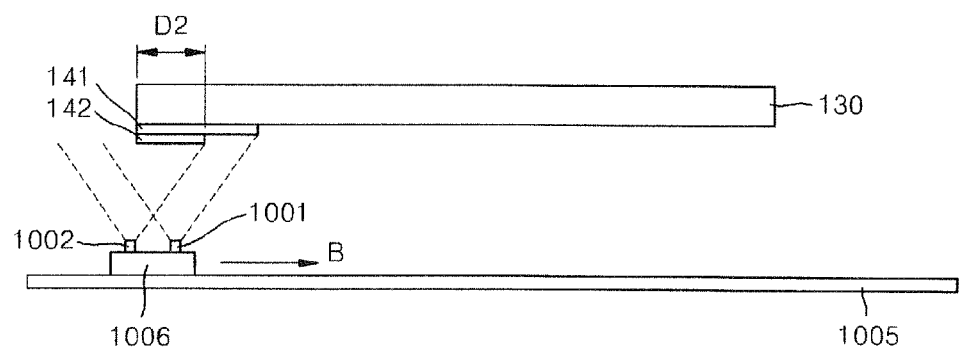

Then, as the base 1006 on which the first deposition source 1001 and the second deposition source 1002 are mounted continuously moves in the B direction, a region (D2) on which the hole transporting material and the charge generating material are simultaneously deposited is formed to form the second HTL 142, including the hole transporting material and the charge generating material, on the first HTL 141 as shown in FIG. 5B. The second HTL 142 is continuously deposited toward the second end E with respect to the second end E (See FIG. 5D) as the base 1006 moves in the B direction.

Figure 5C:
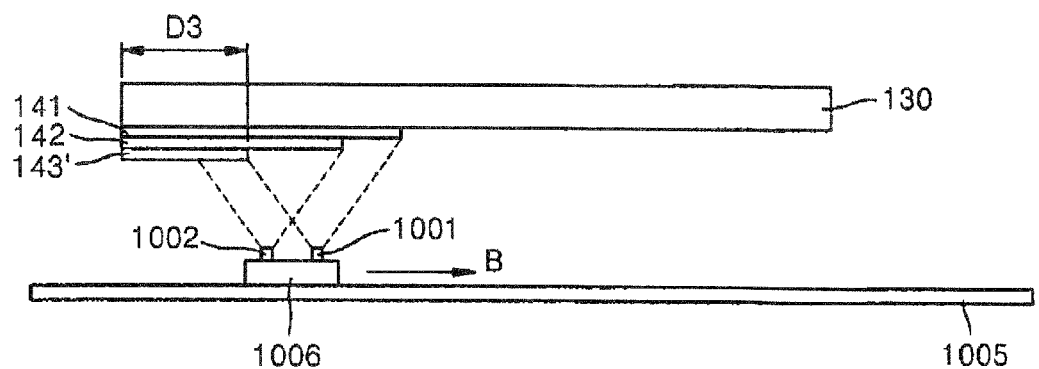

Then, as the base 1006 on which the first deposition source 1001 and the second deposition source 1002 are mounted continuously moves in the B direction, a first charge generating material-containing layer 143' (D3) is formed on the second HTL 142 as shown in FIG. 5C.

Figure 5D:
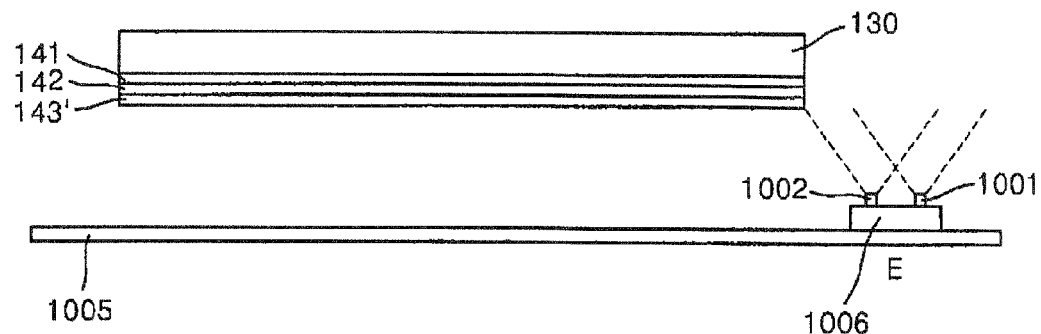

As the base 1006 on which the first deposition source 1001 and the second deposition source 1002 are mounted continuously moves in the B direction and arrives at the second end E of the HIL 130, the first HTL 141 including the hole transporting material, the second HTL 142 including the hole transporting material and the charge generating material, and the first charge generating material-containing layer 143' are formed on the HIL 130 as shown in FIG. 5D.

Figure 5E:
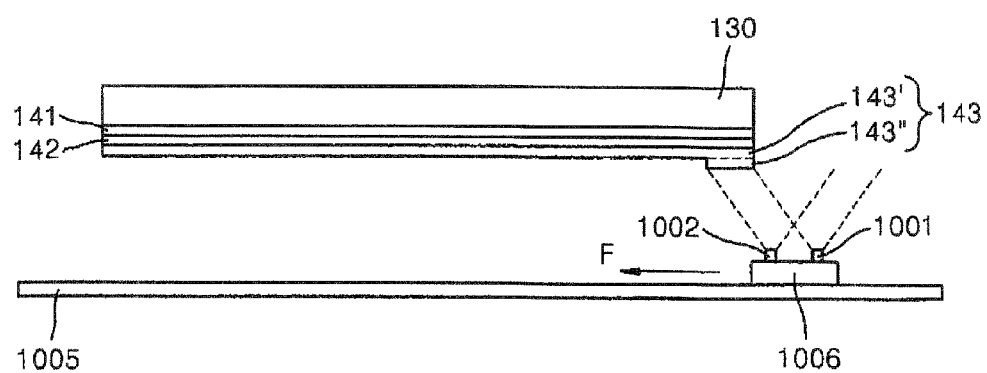
Figure 5F:
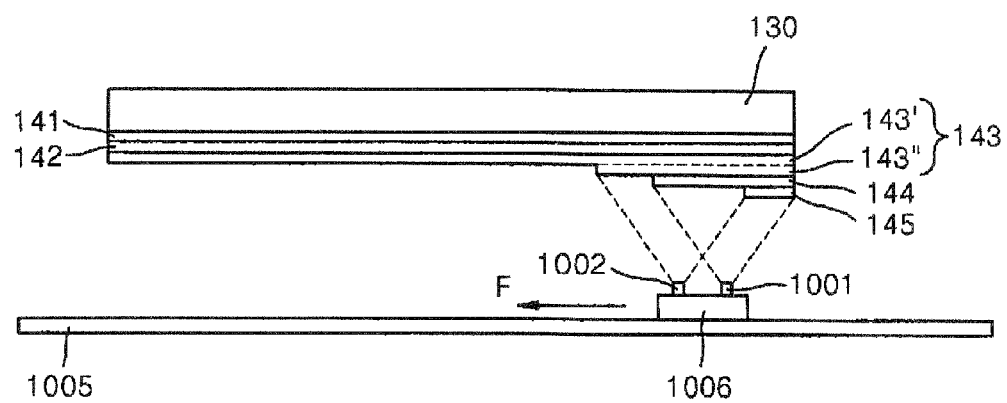

Then, the base 1006 that arrived at the second end E below the HIL 130 changes its direction to start to move in the F direction opposite to the B direction as shown in FIG. 5E. In this regard, a second charge generating material-containing layer 143" is first formed as shown in FIG. 5E.

As the base 1006 continuously moves in the F direction, the fourth HTL 144 including the hole transporting material and the charge generating material and the fifth HTL 145 including the hole transporting material are sequentially formed on the second charge generating material-containing layer 143" as shown in FIG. 5F. Here, the first charge generating material-containing layer 143' and the second charge generating material-containing layer 143" have the same component, i.e., the charge generating material, the interface between the first charge generating material-containing layer 143' and the second charge generating material-containing layer 143" may not be clearly distinguished, so that they may be seen as a single layer, i.e., the third HTL 143 including the charge generating material. Thus, the interface between the first charge generating material-containing layer 143' and the second charge generating material-containing layer 143" is shown as a dash line instead of a solid line in FIG. 5F.

Figure 5G:
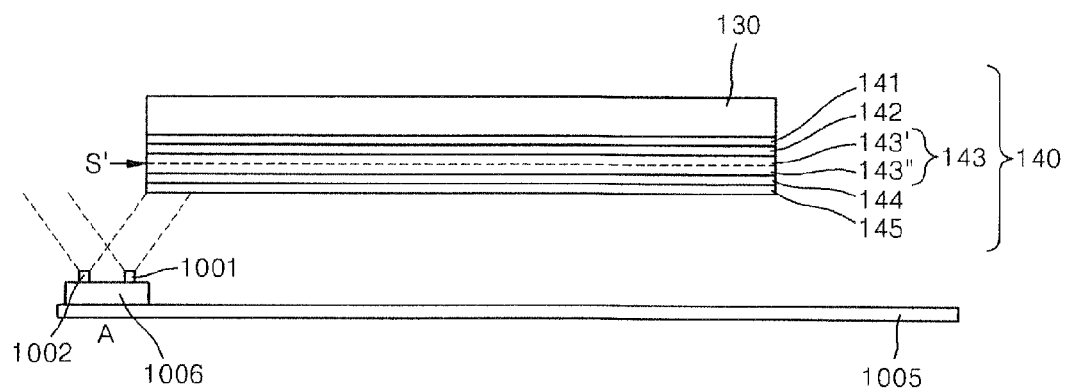

When the base 1006 on which the first deposition source 1001 and the second deposition source 1002 are mounted arrives at the first end A, the first HTL 141 including the hole transporting material, the second HTL 142 including the hole transporting material and the charge generating material, the third HTL 143 including the charge generating material, the fourth HTL 144 including the hole transporting material and the charge generating material, and the fifth HTL 145 including the hole transporting material may be sequentially formed on the HIL 130 as shown in FIG. 5G. In this regard, although the third HTL 143 includes two charge generating material-containing layers, i.e., the first charge generating material-containing layer 143' and the second charge generating material-containing layer 143", an interface S' between the first charge generating material-containing layer 143' and the second charge generating material-containing layer 143" is not clearly distinguished, so that they may be seen as a single layer. Thus, the interface S' is shown as a dash line in FIG. 5G

According to the method of forming the HTL 140 as described above, the HTL 140 including one hole transport unit having the first HTL 141, the second HTL 142, the third HTL 143, the fourth HTL 144, and the fifth HTL 145 may be prepared by one reciprocation of the base 1006 on which the first deposition source 1001 and the second deposition source 1002 are mounted from the first end A to the second end E, and then from the second end E to the first end A. In other words, one hole transport unit may be formed using the method of forming the layers shown in FIG. 5A to 5G. Thus, the stacking process is simply and quickly performed, and a plurality of layers may be simultaneously deposited in a single chamber without evacuating the chamber between the formations of the layers.

The EML 150 may be formed on the HTL 140 by vacuum deposition, spin coating, casting, LB deposition, or the like. When the EML 150 is formed by vacuum deposition or spin coating, the conditions for deposition and coating are similar to those for the formation of the HIL 130, although the conditions for deposition and coating may vary according to the material that is used to form the EML 150.

The EML 150 may be formed of a compound, or a combination of a host and a dopant. Examples of the host include, but are not limited to, $Alq_3$, 4,4'-N,N'- dicarbazole-biphenyl (CBP), poly(n-vinylcarbazole) (PVK), 9,10-di (naphthalene-2-yl)anthracene (ADN), TCTA, 1,3.5-tris(N-phenylbenzimidazole-2-yl)benzene (TPBI), 3-tert-butyl-9, 10-di-2-naphthylanthracene (TBADN), E3, distyrylarylene (DSA), bis(2-(2-hydroxyphenyl)benzothiazolate)zinc (Zn(BTZ)$_2$), Compound 51 below, and Compound 52 below.

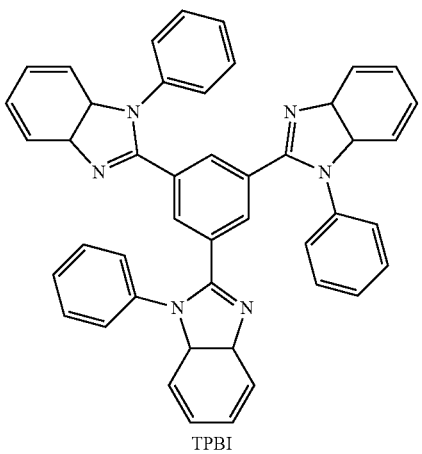

TPBI

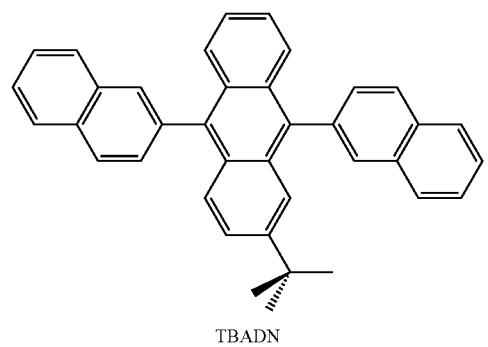

TBADN

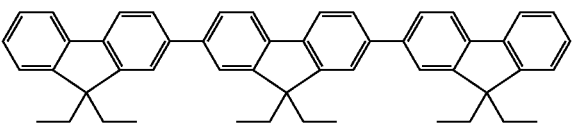

E3

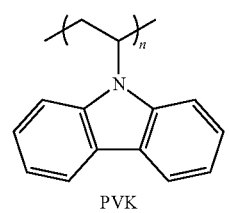

PVK

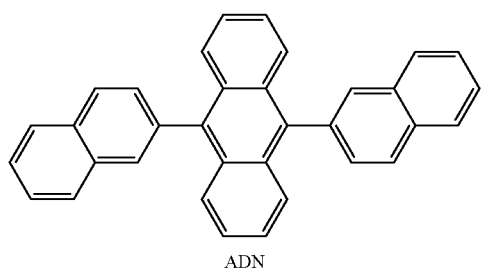

ADN

Compound 51

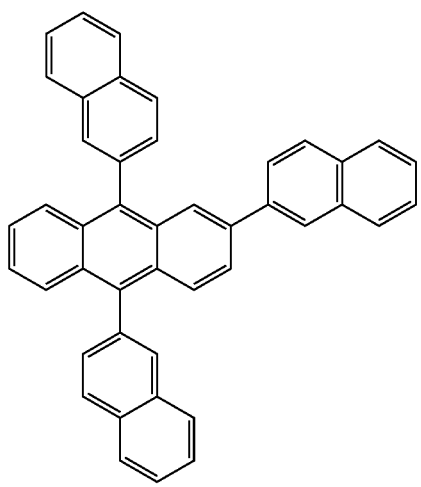

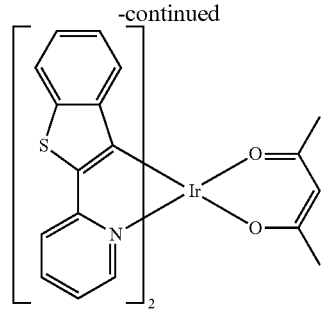

Btp₂Ir(acac)

Examples of green dopants include Ir(ppy)₃ (ppy=phenylpyridine), Ir(ppy)₂(acac), Ir(mpyp)₃, and Compound 53 below, but are not limited thereto.

Compound 52

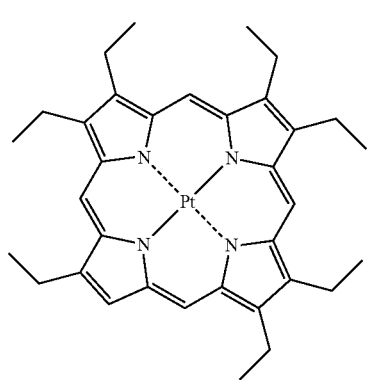

Meanwhile, examples of known red dopants include PtOEP, Ir(piq)₃, and Btp₂Ir(acac), but are not limited thereto.

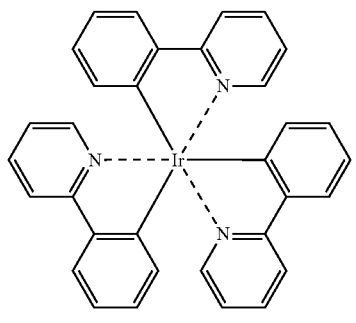

Ir(ppy)₃

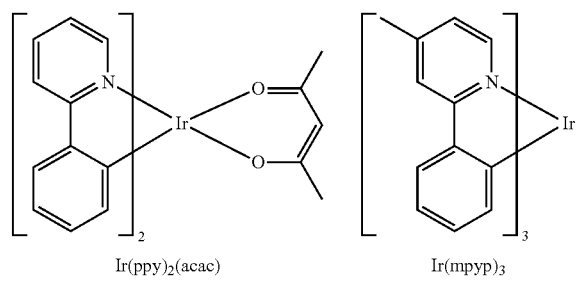

Ir(ppy)₂(acac)   Ir(mpyp)₃

Compound 53

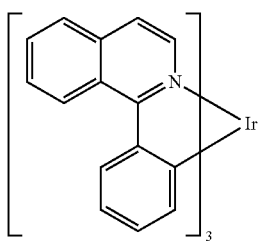

PtOEP

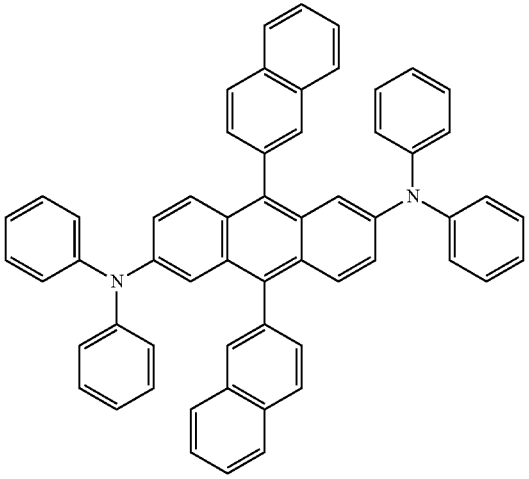

Ir(piq)₃

Meanwhile, examples of known blue dopants include F₂Irpic, (F₂ppy)₂Ir(tmd), Ir(dfppz)₃, ter-fluorene, 4,4'-bis(4-diphenyl aminostyryl)biphenyl (DPAVBi), 2,5,8,11-tetra-tert-butyl perylene (TBPe), Compound 54 below, and 4,4'-bis(2,2-diphenylethenyl)biphenyl (DPVBi).

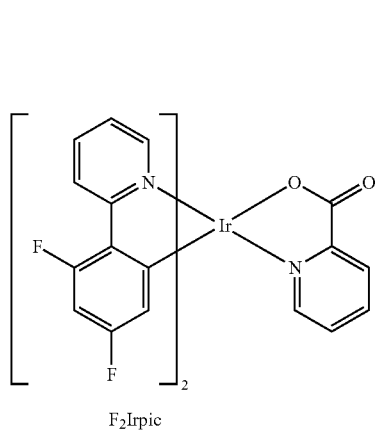
F₂Irpic

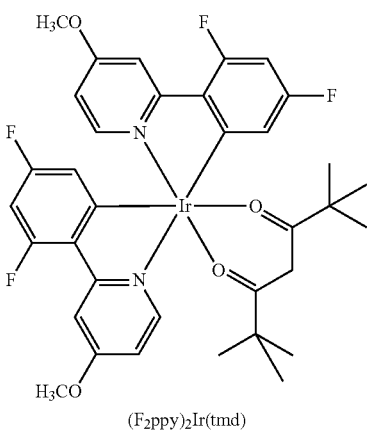
(F₂ppy)₂Ir(tmd)

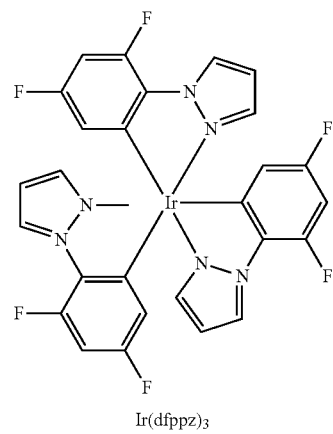
Ir(dfppz)₃

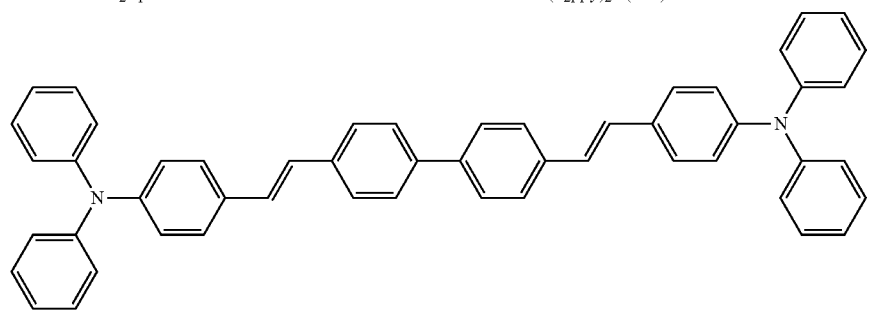
DPAVBi

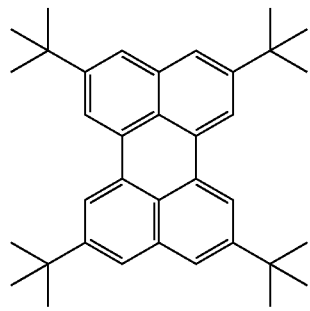
TBPe

Compound 54

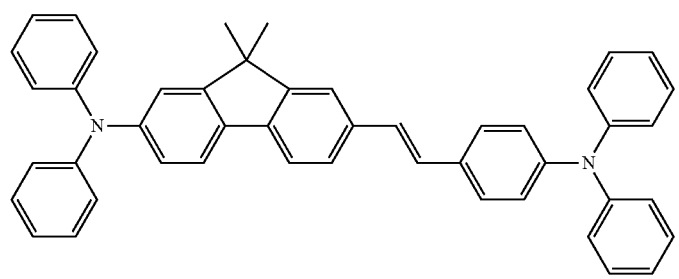

When a dopant and a host are used together, the amount of the dopant may be in the range of about 0.01 to about 15 parts by weight based on 100 parts by weight of the host, but is not limited thereto.

The thickness of the EML 150 may be in the range of about 100 to about 1,000 Å, for example, about 200 to about 600 Å. When the thickness of the EML 150 is within this range of about 100 to about 1,000 Å, the EML 150 may have excellent light emitting ability without a substantial increase in driving voltage.

When a phosphorescent dopant is also used to form the EML 150, a hole blocking layer (HBL) (not shown in FIG. 1) may be formed on the EML 150 by using vacuum deposition, spin coating, casting, LB deposition, or the like, in order to prevent diffusion of triplet excitons or holes into an ETL 160. When the HBL is formed using vacuum deposition or spin coating, the conditions for deposition and coating may be similar to those for the formation of the HIL 130, although the conditions for deposition and coating may vary according to the material that is used to form the HBL.

Any material that is commonly used to form a HBL may be used. Examples of materials for forming the HBL include an oxadiazole derivative, a triazole derivative, and a phenanthroline derivative, but are not limited thereto.

The thickness of the HBL may be in a range of about 50 to about 1,000 Å, for example, about 100 to about 300 Å. When the thickness of the HBL is within this range of about 50 to about 1,000 Å, the HBL may have excellent hole blocking ability without a substantial increase in driving voltage.

The ETL 160 is formed on the EML 150 or on the HBL if the HBL is formed.

The ETL 160 includes an electron transporting material and a metal-containing material.

The electron transporting material may be any electron transporting material.

The electron transporting material may be selected from the group consisting of Compound 60 and compounds represented by Formulae 4, and 5 below.

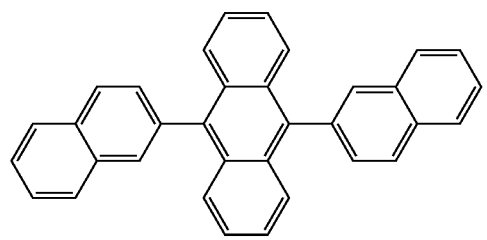

Compound 60: ADN

Formula 4

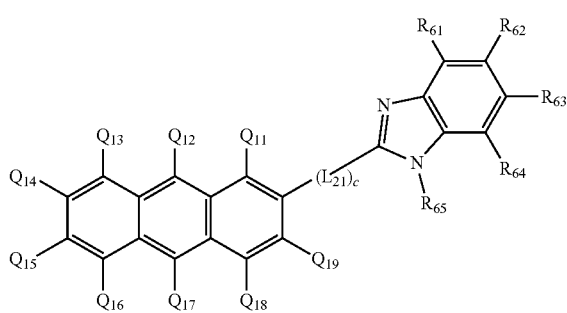

Formula 5

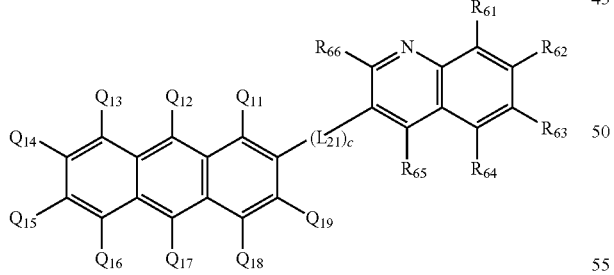

In Formulae 4 and 5, $R_{61}$ to $R_{66}$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group, wherein at least two adjacent groups of $R_{61}$ to $R_{66}$ are optionally bonded to each other to form a saturated or unsaturated ring;

$L_{21}$ is a substituted or unsubstituted $C_1$-$C_{30}$ alkylene group, a substituted or unsubstituted $C_6$-$C_{30}$ arylene group, or a substituted or unsubstituted $C_3$-$C_{30}$ heteroarylene group;

$Q_{11}$ through $Q_{19}$ are, each independently, a hydrogen atom, a substituted or unsubstituted $C_6$-$C_{30}$ aryl group, or a substituted or unsubstituted $C_3$-$C_{30}$ heteroaryl group; and c is an integer from 0 to 10.

For example, $R_{61}$ to $R_{66}$ may be each independently selected from the group consisting of a hydrogen atom, a halogen atom, a hydroxyl group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group, but are not limited thereto.

In particular, in Formula 4 and 5 $R_{61}$ to $R_{64}$ may be hydrogen atoms, and $R_{65}$ may be selected from the group consisting of a halogen atom, a hydroxyl group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group. In addition, in Formula 4 and 5 $R_{61}$ to $R_{66}$ may be hydrogen atoms, but are not limited thereto.

For example, $Q_{11}$ and $Q_{19}$ may be each independently selected from the group consisting of a hydrogen atom, a phenyl group, a naphthyl group, an anthryl group, a pyridinyl group, and a pyrazinyl group, but are not limited thereto.

In particular, in Formulae 4 and 5, $Q_{11}$, $Q_{13}$ through $Q_{16}$, $Q_{18}$, and $Q_{19}$ may be hydrogen atoms, and $Q_{12}$ and $Q_{17}$ may be each independently selected from the group consisting of a phenyl group, a naphthyl group, an anthryl group, a pyridinyl group, and a pyrazinyl group, but are not limited thereto.

For example, $L_{21}$ may be selected from the group consisting of a phenylene group, a naphthylene group, an anthrylene group, a pyridinylene group, and a pyrazinylene group, but is not limited thereto. For example, $L_{21}$ may be a phenylene group or a pyridinylene group.

For example, c may be 1, 2, or 3, but is not limited thereto.

The electron transport material may be Compound 60 shown above or Compound 61 or 62 below.

Compound 61

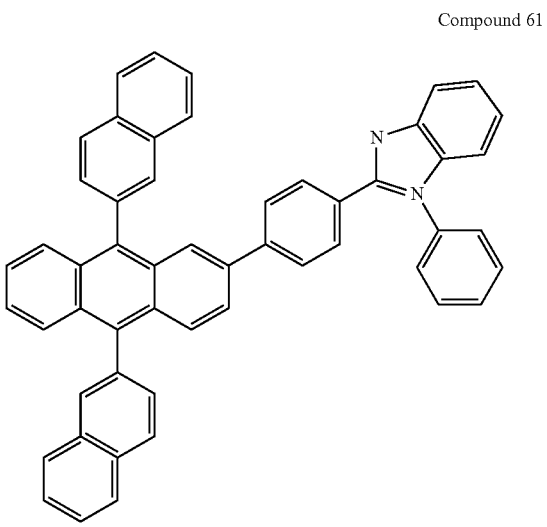

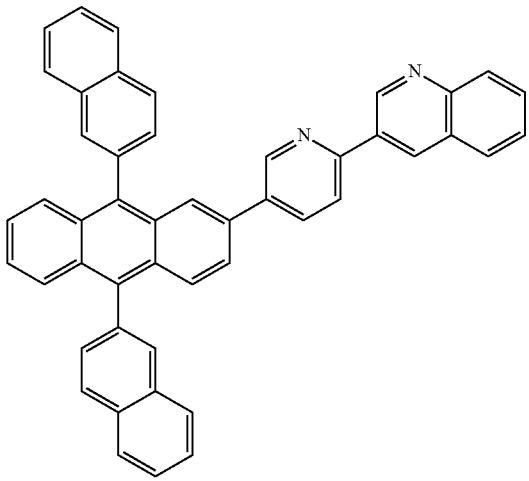

Compound 62

The metal-containing material may inject electrons and block holes. For this, the metal-containing material may be a Li complex.

For example, the metal-containing material may be lithium quinolate (LiQ) or Compound 81 below, but is not limited thereto.

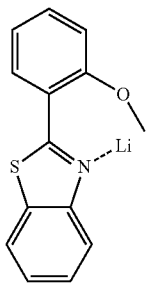

Compound 81: LiBTZ

The thickness of the ETL 160 may be in the range of about 50 to about 1,000 Å, for example, about 100 to about 300 Å. When the thickness of the ETL 160 is within the range of about 50 to about 1,000 Å, an excellent electron transporting ability of the ETL 160 may be obtained without a substantial increase in driving voltage.

The EIL 180, which facilitates injection of electrons from the cathode (second electrode 190), may be formed on the ETL 160. Examples of materials for forming the EIL 180 include LiF, NaCl, CsF, $Li_2O$, and BaO, which are known in the art. Deposition and coating conditions for forming the EIL 180 are similar to those for the formation of the HIL 130, although the deposition and coating conditions may vary according to a material that is used to form the EIL 180.

The thickness of the EIL 180 may be in the range of about 1 to about 100 Å, for example, about 5 to about 90 Å. When the thickness of the EIL 180 is within this range of about 1 to about 100 Å, the EIL 180 may have satisfactory electron injecting ability without a substantial increase in driving voltage.

The second electrode 190 is disposed on the EIL 180. The second electrode 190 may be a cathode, which is an electron injecting electrode. A metal for forming the second electrode 190 may be a metal, an alloy, an electrically conductive compound, which have a low-work function, or a mixture thereof. In this regard, the second electrode 190 may be a reflective electrode formed of lithium (Li), magnesium (Mg), aluminum (Al), aluminum (Al)-lithium (Li), calcium (Ca), magnesium (Mg)-indium (In), magnesium (Mg)-silver (Ag), or the like. Alternatively, the second electrode 190 may be a transmissive or semi-transmissive electrode formed of a transparent conductive material such as ITO and IZO.

The HTL 140 of the OLED 100 has a multi-layered structure, in which energy levels of the layers are similar to each other, and the ETL 160 includes the electron transporting material and the metal-containing material. Thus, the balance in the flow of holes and electrons is maintained for a long period of time, the injection and transport of electrons are adjusted, and holes are blocked, so that the OLED 100 may have long lifetime.

Figure 2:
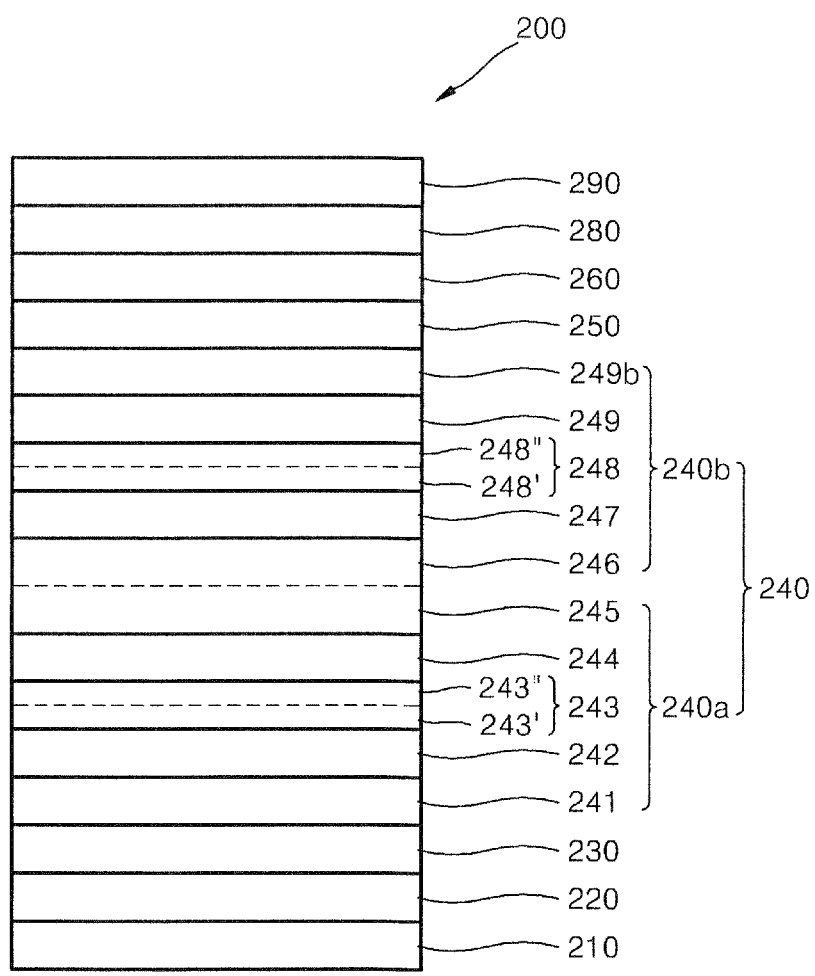
FIG. 2 is a schematic cross-sectional view of an OLED according to another embodiment of the present invention.

FIG. 2 is a schematic cross-sectional view of an OLED 200 according to another embodiment of the present invention.

Referring to FIG. 2, the OLED 200 according to the current embodiment of the present invention includes a substrate 210, and a first electrode 220, a HIL 230, a HTL 240, an EML 250, an ETL 260, an EIL 280, and a second electrode 290 which are sequentially stacked on the substrate 210 in the order stated.

The HTL 240 include two hole transport units, i.e., a first hole transport unit 240a and a second hole transport unit 240b. In particular, the HTL 240 includes: the first hole transport unit 240a including a first HTL 241 having a hole transporting material; a second HTL 242 formed on the first HTL 241 and having the hole transporting material and a charge generating material; a third HTL 243 formed on the second HTL 242 and having the charge generating material; a fourth HTL 244 formed on the third HTL 243 and having the hole transporting material and the charge generating material; and a fifth HTL 245 formed on the fourth HTL 244 and having the hole transporting material; and the second hole transport unit 240b including a sixth HTL 246 formed on the fifth HTL 245 and having the hole transporting material; a seventh HTL 247 formed on the sixth HTL 246 and having the hole transporting material and the charge generating material; an eighth HTL 248 formed on the seventh HTL 247 and having the charge generating material; a ninth HTL 249 formed on the eighth HTL 248 and having the hole transporting material and the charge generating material; and a tenth HTL 249b formed on the ninth HTL 249 and having the hole transporting material.

Since the HTL 240 includes two hole transport units, i.e., the first hole transport unit 240a and the second hole transport unit 240b, the method of forming the layers described with reference to FIGS. 5A to 5G may be repeated twice to prepare the HTL 240. In other words, the base 1006 on which the first deposition source 1001 and the second deposition source 1002 are mounted is reciprocated twice along the guide rail 1005. For example, the HTL 240 may be formed by the following process: start from the first end A→move in the B direction→arrive at the second end E→move in the F direction→arrive at the first end A→move in the B direction→arrive at the second end E→move in the F direction→arrive at the first end A.

When the HTL 240 is formed using the method described above, the third HTL 243 includes two charge generating material-containing layers, i.e., a first charge generating material-containing layer 243' and a second charge generating material-containing layer 243", and components of the two layers are the same as the charge generating material. Thus, the interface between the first charge generating material-containing layer 243' and the second charge generating material-containing layer 243" is not clearly distinguished, so that the third HTL 243 may be seen as a single layer. Similarly, the eighth HTL 248 includes two charge generating material-containing layers, i.e., a first charge generating material-containing layer 248' and a second charge generating material-containing layer 248", and components of the two layers are the same as the charge generating material. Thus, the interface between the first charge generating material-containing layer 248' and the second charge generating material-containing layer 248" is not clearly distinguished, so that the eighth HTL 248 may be seen as a single layer. Thus, the interface between the first charge generating material-containing layer 243' and the second charge generating material-containing layer 243" of the third HTL 243 and the interface between the first charge generating material-containing layer 248' and the second charge generating material-containing layer 248" of the eighth HTL 248 are shown as a dash line instead of a solid line in FIG. 2.

Meanwhile, the interface between the fifth HTL 245 and the sixth HTL 246 is shown as a dash line in FIG. 2. Since the component of the fifth HTL 245 (hole transporting material) formed after the first reciprocation of the base 1006 (start from the first end A→move in the B direction-→arrive at the second end E→move in the F direction→arrive at the first end A) is the same as the component of the sixth HTL 246 (hole transporting material) formed by the second reciprocation of the base 1006 that starts from the first end A after the first reciprocation, the interface between the fifth HTL 245 and the sixth HTL 246 is not clearly distinguished, and thus the fifth HTL 245 and the sixth HTL 246 may be seen as a single layer.

The OLED 200 of FIG. 2 has the same structure as the OLED 100 of FIG. 1, except that the OLED 200 includes the HTL 240 having two hole transport units instead of one hole transport unit, and thus the material used to form each layer and the thickness of each layer of the OLED 200 are defined as described above with reference to FIG. 1.

Figure 3:
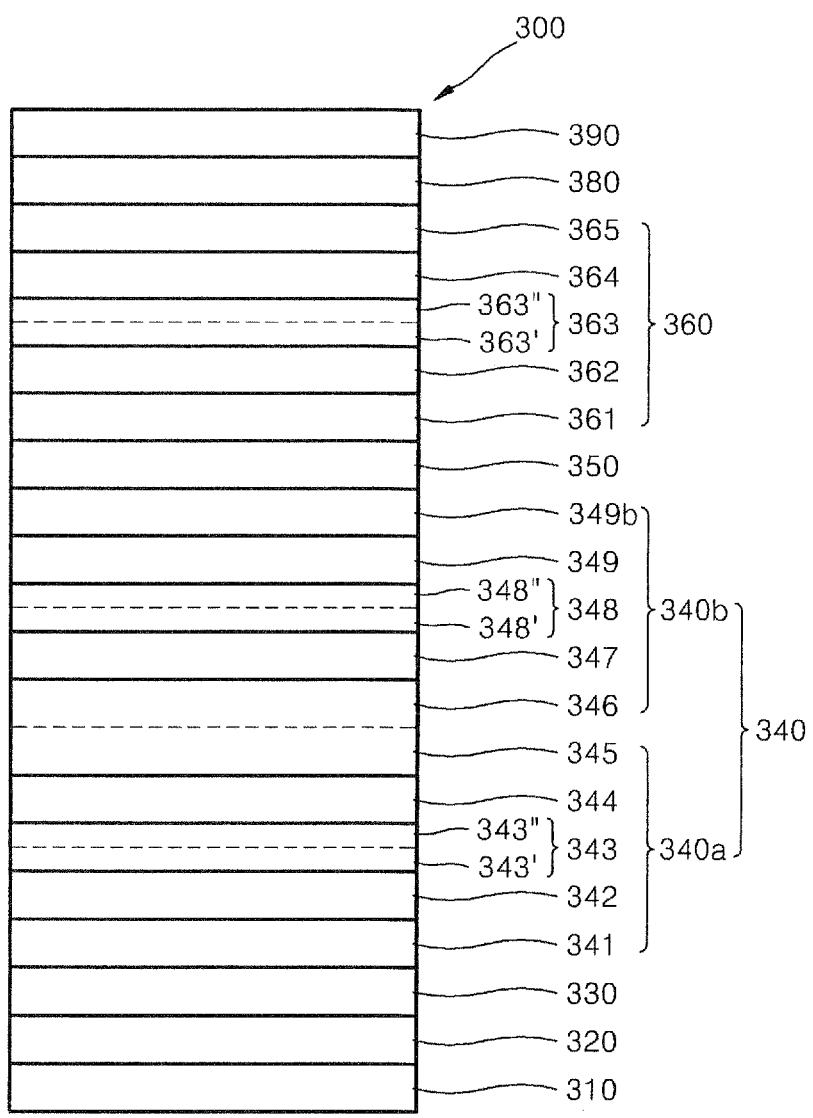
FIG. 3 is a schematic cross-sectional view of an OLED according to another embodiment of the present invention.

FIG. 3 is a schematic cross-sectional view of an OLED 300 according to another embodiment of the present invention.

Referring to FIG. 3, the OLED 300 according to the current embodiment includes a substrate 310, and a first electrode 320, a HIL 330, a HTL 340, an EML 350, an ETL 360, an EIL 380, and a second electrode 390 which are sequentially stacked on the substrate 310 in the order stated.

The HTL 340 include two hole transport units, i.e., a first hole transport unit 340a and a second hole transport unit 340b. In particular, the HTL 340 includes: the first hole transport unit 340a including a first HTL 341 having a hole transporting material; a second HTL 342 formed on the first HTL 341 and having the hole transporting material and a charge generating material; a third HTL 343 formed on the second HTL 342 and having the charge generating material; a fourth HTL 344 formed on the third HTL 343 and having the hole transporting material and the charge generating material; and a fifth HTL 345 formed on the fourth HTL 344 and having the hole transporting material; and the second hole transport unit 340b including a sixth HTL 346 formed on the fifth HTL 345 and having a hole transporting material; a seventh HTL 347 formed on the sixth HTL 346 and having the hole transporting material and the charge generating material; an eighth HTL 348 formed on the seventh HTL 347 and having the charge generating material; a ninth HTL 349 formed on the eighth HTL 348 and having the hole transporting material and the charge generating material; and a tenth HTL 349b formed on the ninth HTL 349 and having the hole transporting material.

The HTL 340 is defined as the HTL 240 described above.

The ETL 360 includes one electron transport unit including: a first ETL 361 having an electron transporting material; a second ETL 362 formed on the first ETL 361 and having the electron transporting material and the metal-containing material; a third ETL 363 formed on the second ETL 362 and having the metal-containing material; a fourth ETL 364 formed on the third ETL 363 and having the electron transporting material and the metal-containing material; and a fifth ETL 365 formed on the fourth ETL 364 and having the electron transporting material.

The ETL 360 has a structure in which the second ETL 362, the third ETL 363, the fourth ETL 364, and the fifth ETL 365 are sequentially stacked on the first ETL 361 in the order stated, so that injection and transport of electrons may be controlled and holes may be blocked. In the OLED 300, the number of excitons generated in emission regions may be gradually reduced since the amount of electrons or holes may change with time during the operation of the OLED 300. As a result, a carrier balance may not be maintained, and thus, the lifetime of the OLED 300 may be reduced. However, since the ETL 360 has a stack structure of a plurality of layers with a similar or same energy level (the first ETL 361, the second ETL 362, the third ETL 363, the fourth ETL 364, and the fifth ETL 365), the flow of carriers may be constantly maintained while controlling migration rates of electrons. Thus, lifetime characteristics of the OLED 300 may be improved.

The ETL 360 may be formed by preparing a third deposition source releasing the electron transporting material and a fourth deposition source releasing the metal-containing material, disposing the third deposition source and the fourth deposition source to be spaced apart from each other such that a region to which the electron transporting material is released overlaps a region to which the metal-containing material is released, and performing one reciprocation of the third and fourth deposition sources from a first end to a second end, and then from the second end to the first end of a region on which the ETL 360 will be formed (on the EML 350).

The method of forming the ETL 360 may be easily understood by the descriptions above with reference to FIGS. 5A to 5G and replacing the hole transporting material with the electron transporting material, replacing the charge generating material with the metal-containing material, replacing the first deposition source with the third deposition source, and replacing the second deposition source with the fourth deposition source.

As described above, when the ETL 360 is formed, a first metal-containing material-containing layer 363' and a second metal-containing material-containing layer 363" have the same component, i.e., the metal-containing material, the interface between the first metal-containing material-containing layer 363' and the second metal-containing material-containing layer 363" may not be clearly distinguished, so that they may be seen as a single layer, i.e., the third ETL 363 including the metal-containing material. Thus, the interface between the first metal-containing material-containing layer 363' and the second metal-containing material-containing layer 363" is shown as a dash line instead of a solid line in FIG. 3.

The thicknesses of the first ETL 361, the third ETL 363, and the fifth ETL 365 may be each independently in the range of about 0.01 nm to about 1 nm, for example, about 0.5 nm to about 0.7 nm. When the thicknesses of the first ETL 361, the third ETL 363, and the fifth ETL 365 are within this range of about 0.01 nm to about 1 nm, electrons may effectively be injected and transported to the EML 350 without a substantial increase in driving voltage. The thicknesses of the first ETL 361, the third ETL 363, and the fifth ETL 365 may be the same or different.

The thicknesses of the second ETL 362 and the fourth ETL 364 may be each independently a thickness in the range of about 6 nm to about 16 nm, for example, about 6 nm to about 10 nm. When the thicknesses of the second ETL 362 and the fourth ETL 364 are within this range of about 6 nm to about 16 nm, electrons may effectively be injected and transported to the EML 350 without a substantial increase in driving voltage. The thicknesses of the second ETL 362 and the fourth ETL 364 may be the same or different.

The amount of the metal-containing material contained in the second ETL 362 may be in the range of about 20 to about 80 parts by weight, for example, about 45 to about 55 parts by weight based on 100 parts by weight of the second ETL 362. The amount of the metal-containing material contained in the fourth ETL 364 may be in the range of about 20 to about 80 parts by weight, for example, about 45 to about 55 parts by weight based on 100 parts by weight of the fourth ETL 364. When the amount of the metal-containing material contained in the second ETL 362 and the fourth ETL 364 is within the range of about 20 to about 80 parts by weight, the efficiency of OLED 300 may be improved.

The electron transporting material and the metal-containing material of the ETL 360 are defined as described above with reference to FIG. 1.

The OLED 300 of FIG. 3 has the same structure as the OLED 200 of FIG. 2, except that the OLED 300 includes the ETL 360 having a multi-layered structure, and thus the material used to form each layer and the thickness of each layer of the OLED 300 are defined as described above with reference to FIGS. 1 and 2.

Figure 4:
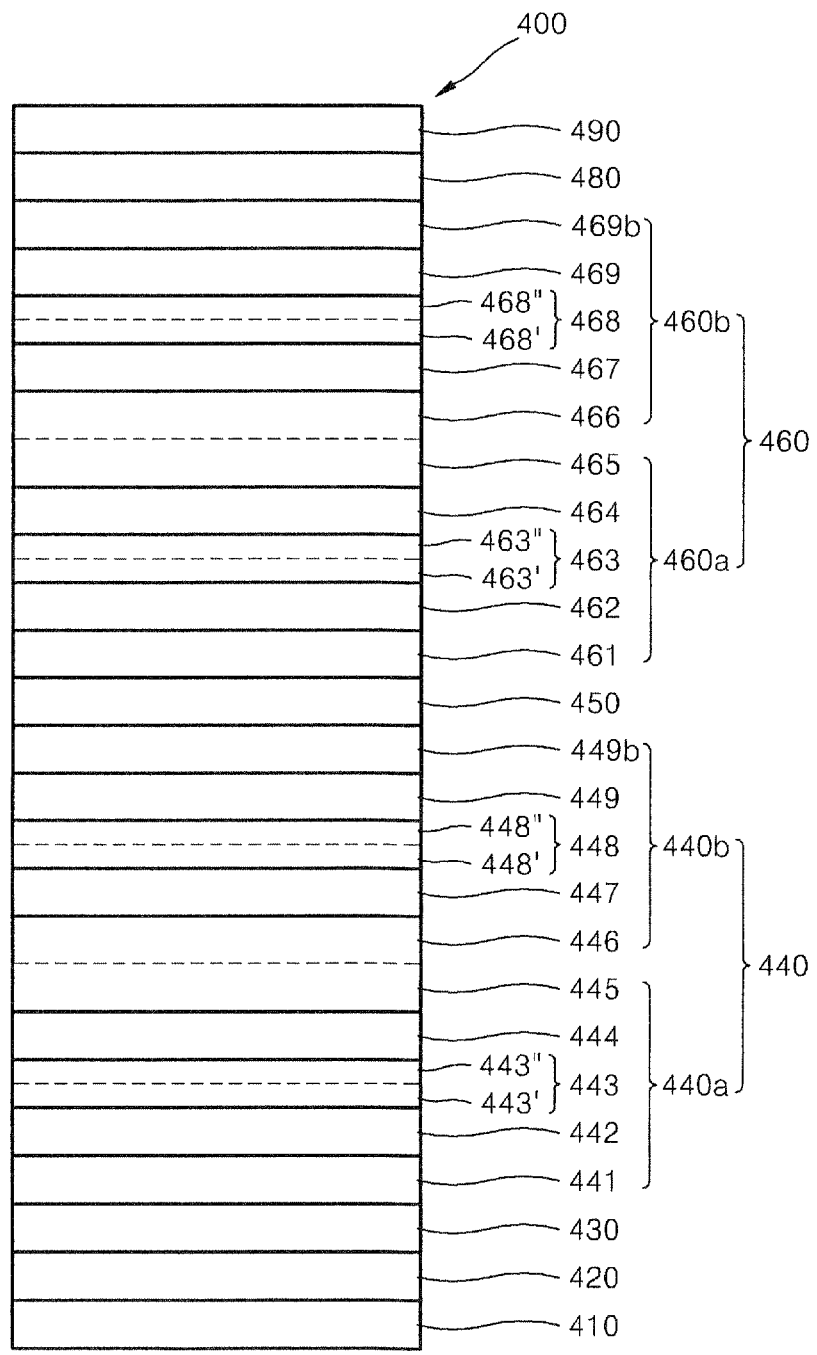
FIG. 4 is a schematic cross-sectional view of an OLED according to another embodiment of the present invention.

FIG. 4 is a schematic cross-sectional view of an OLED 400 according to another embodiment of the present invention.

Referring to FIG. 4, the OLED 400 according to the current embodiment of the present invention includes a substrate 410, and a first electrode 420, a HIL 430, a HTL 440, an EML 450, an ETL 460, an EIL 480, and a second electrode 490 which are sequentially stacked on the substrate 410 in the order stated.

The HTL 440 include two hole transport units, i.e., a first hole transport unit 440a and a second hole transport unit 440b. In particular, the HTL 440 includes: the first hole transport unit 440a including a first HTL 441 having a hole transporting material; a second HTL 442 formed on the first HTL 441 and having the hole transporting material and a charge generating material; a third HTL 443 formed on the second HTL 442 and having the charge generating material; a fourth HTL 444 formed on the third HTL 443 and having the hole transporting material and the charge generating material; and a fifth HTL 445 formed on the fourth HTL 444 and having the hole transporting material; and the second hole transport unit 440b including a sixth HTL 446 formed on the fifth HTL 445 and having a hole transporting material; a seventh HTL 447 formed on the sixth HTL 446 and having the hole transporting material and the charge generating material; an eighth HTL 448 formed on the seventh HTL 447 and having the charge generating material; a ninth HTL 449 formed on the eighth HTL 448 and having the hole transporting material and the charge generating material; and a tenth HTL 449b formed on the ninth HTL 449 and having the hole transporting material.

The HTL 440 is defined as the HTL 240 described above.

The ETL 460 includes two electron transport units, i.e., a first electron transport unit 460a and a second electron transport unit 460b. In particular, the ETL 460 includes: the first electron transport unit 460a including a first ETL 461 having an electron transporting material; a second ETL 462 formed on the first ETL 461 and having the electron transporting material and the metal-containing material; a third ETL 463 formed on the second ETL 462 and having the metal-containing material; a fourth ETL 464 formed on the third ETL 463 and having the electron transporting material and the metal-containing material; and a fifth ETL 465 formed on the fourth ETL 464 and having the electron transporting material; and the second electron transport unit 460b including a sixth ETL 466 formed on the fifth ETL 465 and having the electron transporting material; a seventh ETL 467 formed on the sixth ETL 466 and having the electron transporting material and the metal-containing material; a eighth ETL 468 formed on the seventh ETL 467 and having the metal-containing material; a ninth ETL 469 formed on the eighth ETL 468 and having the electron transporting material and the metal-containing material; and a tenth ETL 469b formed on the ninth ETL 469 and having the electron transporting material.

Since the ETL 460 includes two electron transport units, i.e., the first electron transport unit 460a and the second electron transport unit 460b, the method of forming the layers described with reference to FIGS. 5A to 5G may be repeated twice to prepare the ETL 460 and replacing the hole transporting material with the electron transporting material, replacing the charge generating material with the metal-containing material, replacing the first deposition source with the third deposition source, and replacing the second deposition source with the fourth deposition source.

When the ETL 460 is formed using the method described above, the third ETL 463 includes two metal-containing, material-containing layers, i.e., a first metal-containing material-containing layer 463' and a second metal-containing material-containing layer 463", and components of the two layers are the same as the metal-containing material. Thus, the interface between the first metal-containing material-containing layer 463' and the second metal-containing material-containing layer 463" is not clearly distinguished, so that the third ETL 463 may be seen as a single layer. Similarly, the eighth ETL 468 may be seen as a single layer.

Meanwhile, the interface between the fifth ETL 465 and the sixth ETL 466 is shown as a dash line in FIG. 4. Since the component of the fifth ETL 465 (electron transporting material) formed after the first reciprocation of the base 1006 (start from the first end A→move in the B direction→arrive at the second end E→move in the F direction→arrive at the first end A) is the same as the component of the sixth ETL 466 (electron transporting material) formed by the second reciprocation of the base 1006 that starts from the first end A after the first reciprocation, the interface between the fifth ETL 465 and the sixth ETL 466 is not clearly distinguished, and thus the fifth ETL 465 and the sixth ETL 466 may be seen as a single layer.

The OLED 400 of FIG. 4 has the same structure as the OLED 300 of FIG. 3, except that the OLED 400 includes the ETL 460 having two electron transport units instead of one electron transport unit, and thus the material used to form each layer and the thickness of each layer of the OLED 400 are defined as described above with reference to FIGS. 1, 2, and 3.

Figure 6:
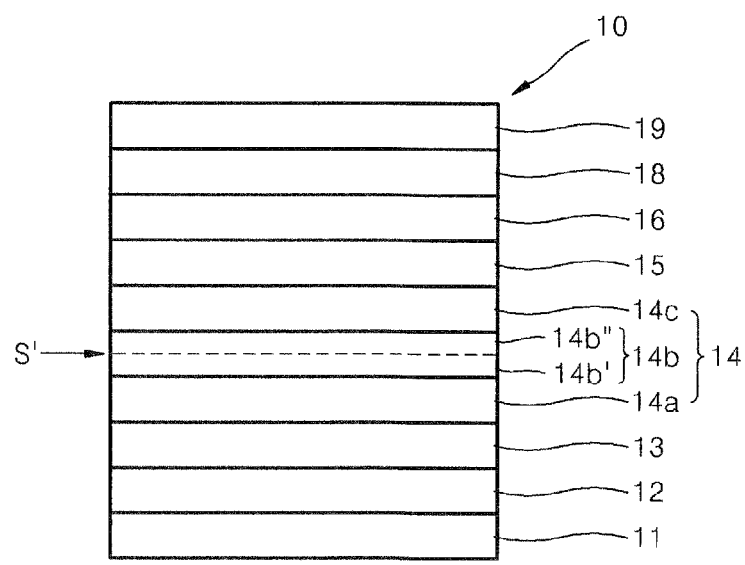
FIG. 6 is a schematic cross-sectional view of an OLED according to another embodiment of the present invention.

FIG. 6 is a schematic sectional view of an OLED 10 according to another embodiment of the present invention. Referring to FIG. 6, the OLED 10 according to the current embodiment of the present invention includes a substrate 11, and a first electrode 12, a HIL 13, a HTL 14, an EML 15, an ETL 16, an EIL 18, and a second electrode 19 which are sequentially stacked on the substrate 11 in the order stated. The HTL 14 includes one hole transport unit including: a first HTL 14a having a hole transporting material; a third HTL 14b formed on the first HTL 14a and having a charge generating material; and a fifth HTL 14c formed on the third HTL 14b and having the hole transporting material.

In the OLED 10, the substrate 11, the first electrode 12, the HIL 13, the EML 15, the ETL 16, the EIL 18, and the second electrode 19 are defined as described above with reference to FIG. 1.

The HTL 14 includes the first HTL 14a, the third HTL 14b, and the fifth HTL 14c which are defined as described above with reference to first HTL 141, the third HTL 143, and the fifth HTL 145 of FIG. 1. That is, the OLED 10 of FIG. 6 has the same structure as the OLED 100 of FIG. 1, except that the OLED 10 does not include the second HTL 142 and the fourth HTL 144 of FIG. 1.

The third HTL 14b of the OLED 10 may include the charge generating material as described above. The third HTL 14b may include a first charge generating material-containing layer 14b' and a second charge generating material-containing layer 14b". The interface S' between the first charge generating material-containing layer 14b' and the second charge generating material-containing layer 14b" is not clearly distinguished, so that they may be seen as a single layer, i.e. the third HTL 14b including the charge generating material. Thus, the interface between the first charge generating material-containing layer 14b' and the second charge generating material-containing layer 14b" is shown as a dash line instead of a solid line in FIG. 5F.

The HTL 14 has a structure in which the first HTL 14a, the third HTL 14b, and the fifth HTL 14c are sequentially stacked, so that injection and transport of holes may be controlled and electrons may be blocked. Accordingly, lifetime characteristics of the OLED 10 may be improved.

The HTL 14 of the OLED 10 may be formed by preparing the base 1006 on which the first deposition source 1001 and the second deposition source 1002 are mounted, as shown in FIG. 5A, disposing a anti-deposition plate between the first deposition source 1001 and the second deposition source 1002, and reciprocating the base 1006 once according to the following process: start from the first end A→move in the B direction→arrive at the second end E→move in the F direction→arrive at the first end A. As described above, since the anti-deposition plate is disposed between the first deposition source 1001 and the second deposition source 1002, the simultaneous deposition of the hole transporting material released from the first deposition source 1001 and the charge generating material released from the second deposition source 1002 is substantially prevented, and thus the first HTL 14a, the third HTL 14b, and the fifth HTL 14c may be sequentially stacked.

The OLED and the method of manufacturing the OLED according to an embodiment of the present invention are described with reference to FIGS. 1, 2, 3, 4, 5a to 5g, and 6, but are not limited thereto, and various modifications may be applied thereto. For example, the HTL of the OLED according to an embodiment may include three or more hole transport units and/or the ETL of the OLED may include three or more electron transport units, and various modifications may be applied thereto. In addition, if desired, the HTL may be formed on the first electrode without forming the HIL, and various modifications may be applied thereto.

The HTL and the ETL described above may also be combined with each other. For example, an OLED including the HTL 14 of the OLED 10 shown in FIG. 6 and the ETL 360 of the OLED 300 in FIG. 3 may also be manufactured.

Meanwhile, even though not shown in FIGS. 1 to 4, a sealing layer may further be formed on the second electrode in order to seal the OLED, and various modifications may be applied thereto.

Hereinafter, one or more embodiments will be described in detail with reference to the following examples. These examples are not intended to limit the purpose and scope of the one or more embodiments of the present invention.

EXAMPLES

Example 1

A glass substrate including a 150 $\Omega cm^2$ (70 Å) ITO (a first electrode) (available from Corning Co.) was cut to a size of 50 mm×50 mm×0.5 mm, ultrasonically washed with isopropyl alcohol for 5 minutes and then with pure water for 5 minutes, heat-treated for 30 minutes, and treated with $N_2$ plasma. A HTL was formed on the ITO electrode using Compound 14 as a hole injecting and transporting material and Compound 40 as a charge generating material by using the method described with reference to FIGS. 5A to 5G, by which the first deposition source 1001 emits Compound 14 and the second deposition source 1002 emits Compound 40 while the base 1006 reciprocates once (start from the first end A→move in the B direction→arrive at the second end E→move in the F direction→arrive at the first end A). As a result, a HTL including one hole transport unit including a first HTL formed of Compound 14 and having a thickness of 600 Å, a second HTL formed of Compound 14 and Compound 40 and having a thickness of 10 Å, a third HTL formed of Compound 40 and having a thickness of 30 Å, a fourth HTL formed of Compound 14 and Compound 40 and having a thickness of 10 Å, and a fifth HTL formed of Compound 14 and having a thickness of 600 Å was prepared. 97 wt % of $Alq_3$ as a host and 3 wt % of DPVBI as a dopant were deposited on the HTL to form an. EML having a thickness of 200 Å. Compound 62 and LiQ were co-deposited on the EML to form an ETL having a thickness of 300 Å, wherein the amount of LiQ was 50 parts by weight based on 100 parts by weight of the ETL, and LiF was vacuum-deposited on the ETL to form an EIL having a thickness of 5 Å. Then, Mg and Ag were vacuum-deposited on the EIL to form a second electrode having a thickness of 120 Å, and $Alq_3$ was vacuum-deposited on the second electrode to form an organic capping layer, thereby completing the manufacture of an OLED.

Compound 14

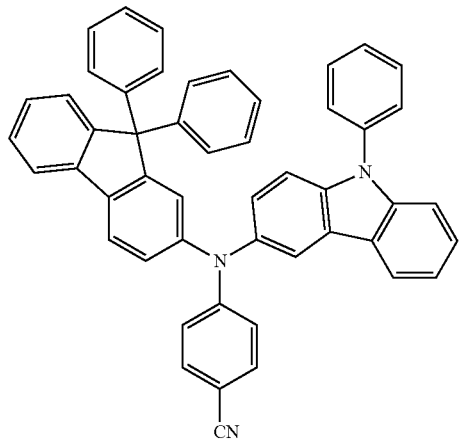

Compound 40

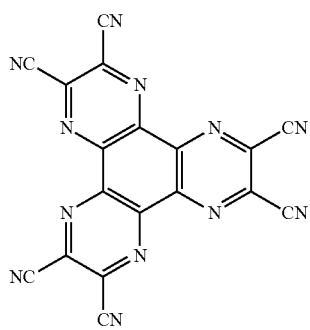

Compound 62

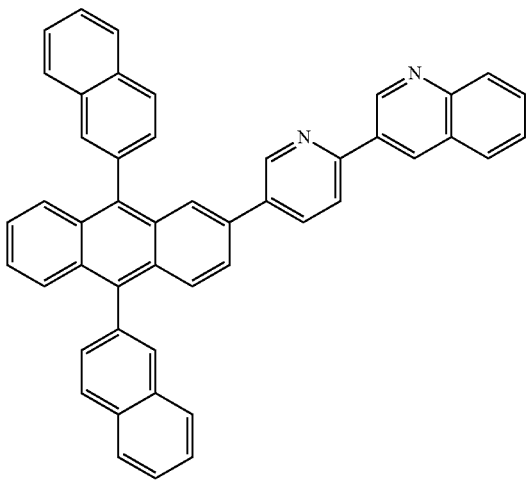

Evaluation Example 1

Figure 7:
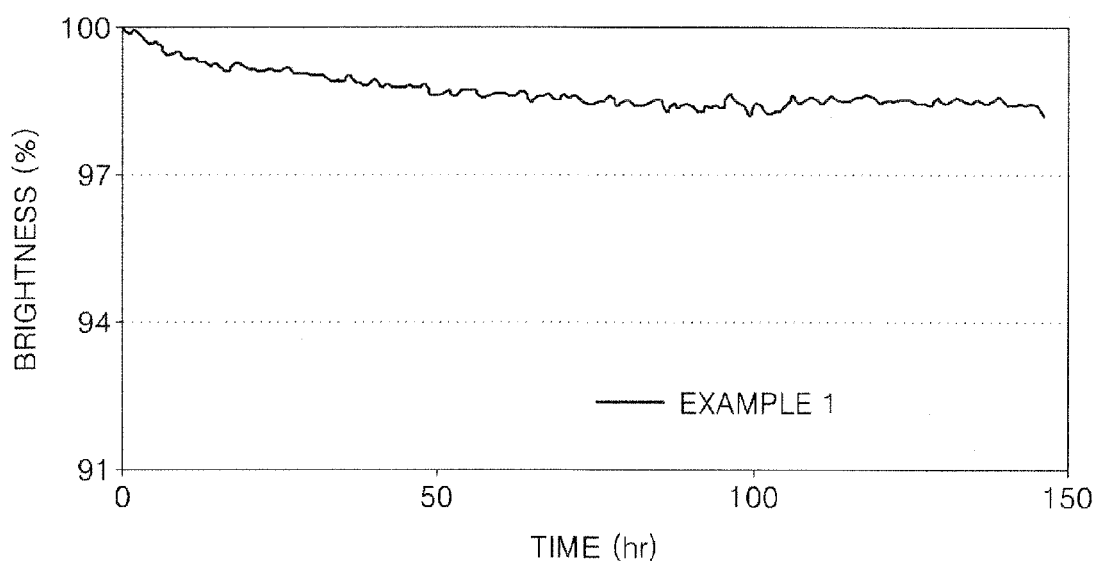
FIG. 7 is a graph illustrating time-brightness of an OLED according to Example 1.
Figure 8:
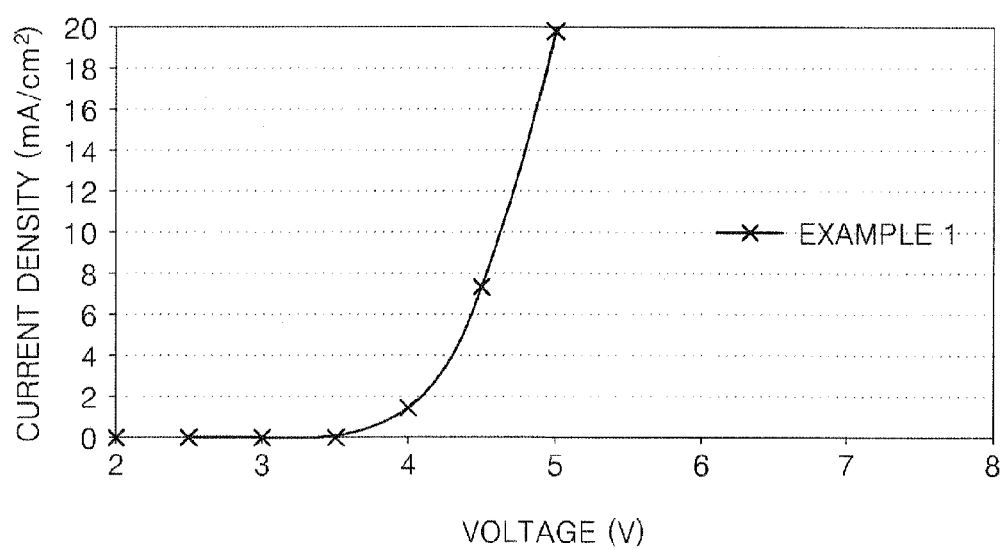
FIG. 8 is a graph illustrating voltage-current density of an OLED according to Example 1.

FIG. 7 is a graph illustrating time-brightness of an OLED according to Example 1. In FIG. 7, the Y-axis indicates brightness (%). When the time is zero (0), the brightness is 100%. The brightness was evaluated using a PR650 (Spectroscan) Source Measurement Unit. (PhotoResearch). FIG. 8 is a graph illustrating voltage-current density of the OLED according to Example 1. In FIG. 8, the X-axis indicates voltage (V), and the Y-axis indicates current density (mA/cm$^2$). Referring to FIGS. 7 and 8, the OLED manufactured according to Example 1 has excellent electrical and lifetime characteristics.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. An organic light-emitting device comprising:
   a substrate;
   a first electrode formed on the substrate;
   a second electrode;
   an emission layer between the first electrode and the second electrode;
   a hole transport layer between the first electrode and the emission layer, the hole transport layer comprising a first hole transport unit comprising:
     a first hole transport layer comprising a hole transporting material;
     a third hole transport layer formed on the first hole transport layer and comprising a charge generating material; and
     a fifth hole transport layer formed on the third hole transport layer and comprising the hole transporting material; and
   an electron transport layer between the second electrode and the emission layer, the electron transport layer comprising an electron transporting material and a metal-containing material,
   wherein the hole transporting material is represented by Formula 2 below:

Formula 2

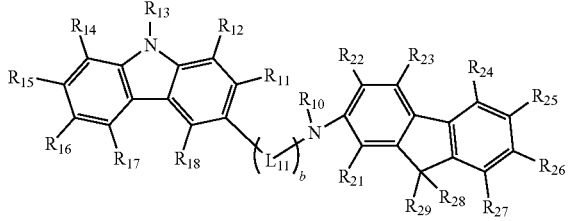

wherein $R_{10}$ is represented by $-(Ar_1)_n-Ar_2$;
$R_{16}$ is represented by $-(Ar_{11})_m-Ar_{12}$;
$Ar_1$, $Ar_{11}$, and $L_{11}$ are each independently selected from the group consisting of a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_4$-$C_{30}$ heteroarylene group, and $-N(Q_1)-$;
n, m, a, and b are each independently an integer from 0 to 10;
$R_{11}$ through $R_{15}$, $R_{17}$, $R_{18}$, $R_{21}$ through $R_{29}$, $Ar_2$, $Ar_{12}$, and $Q_1$ are each independently selected from the group consisting of a hydrogen atom, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, a substituted or unsubstituted $C_4$-$C_{30}$ heteroaryl group, and $-N(Q_2)(Q_3)$; and $Q_2$ and $Q_3$ are each independently a hydrogen atom, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, and a substituted or unsubstituted $C_4$-$C_{30}$ heteroaryl group, wherein n groups of $Ar_1$ in —$(Ar_1)_n$— may be identical to or different from each other, m groups of $Ar_{11}$ in —$(Ar_{11})_m$— may be identical to or different from each other, and b groups of $L_{11}$ in -$(L_{11})_b$- may be identical to or different from each other, wherein the electron transporting material contained in the electron transport layer is selected from the group consisting of Compound 60 and compounds represented by Formulae 4 and 5 below, and wherein the metal-containing material contained in the electron transport layer comprises a Li complex:

Compound 60

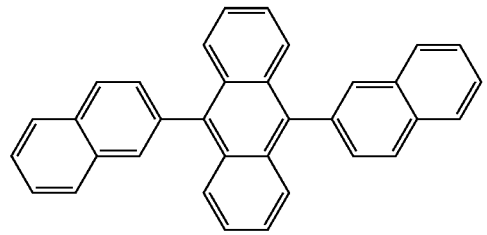

Formula 4

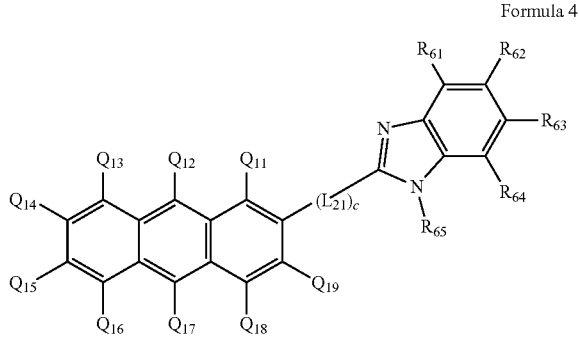

Formula 5

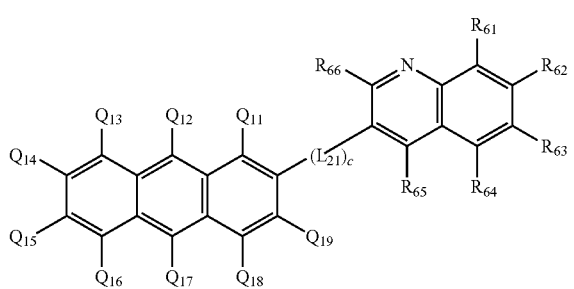

wherein $R_{61}$ to $R_{66}$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group, wherein at least two adjacent groups of $R_{61}$ to $R_{66}$ are selectively bonded to each other to form a saturated or unsaturated ring;

$L_{21}$ is a substituted or unsubstituted $C_1$-$C_{30}$ alkylene group, a substituted or unsubstituted $C_6$-$C_{30}$ arylene group, or a substituted or unsubstituted $C_3$-$C_{30}$ heteroarylene group;

$Q_{11}$ through $Q_{19}$ are each independently a hydrogen atom, a substituted or unsubstituted $C_6$-$C_{30}$ aryl group, or a substituted or unsubstituted $C_3$-$C_{30}$ heteroaryl group; and c is an integer from 0 to 10.

2. The organic light-emitting device of claim 1, wherein the charge generating material comprises a compound represented by Formula 3 below:

Formula 3

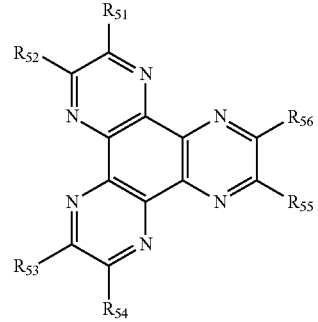

wherein, $R_{51}$ to $R_{56}$ are each independently selected from the group consisting of a hydrogen atom, —CN, —SOR$^{100}$, —SON(R$^{101}$)$_2$, —SO$_2$R$^{102}$, —SO$_2$N(R$^{103}$)$_2$, —SO$_3$R$^{104}$, —SO$_3$N(R$^{105}$)$_2$, —NO$_2$, —CFH$_2$, —CF$_2$H, and —CF$_3$, and R$^{100}$ to R$^{105}$ are each independently selected from the group consisting of a hydrogen atom, a substituted or unsubstituted $C_1$-$C_{30}$ alkyl group, a substituted or unsubstituted $C_5$-$C_{30}$ aryl group, and a substituted or unsubstituted $C_4$-$C_{30}$ heteroaryl group.

3. The organic light-emitting device of claim 1, wherein the thicknesses of the first hole transport layer, the third hole transport layer, and the fifth hole transport layer are each independently in the range of about 0.1 nm to about 100 nm.

4. The organic light-emitting device of claim 1, wherein the thicknesses of the second hole transport layer and the fourth hole transport layer are each independently in the range of about 0.01 nm to about 16 nm.

5. The organic light-emitting device of claim 1, wherein the amount of the charge generating material contained in the second hole transport layer is in the range of about 0.01 to about 99 parts by weight based on 100 parts by weight of the second hole transport layer, and the amount of the charge generating material contained in the fourth hole transport layer is in the range of about 0.01 to about 99 parts by weight based on 100 parts by weight of the fourth hole transport layer.

6. The organic light-emitting device of claim 1, wherein the hole transport layer comprises:
the first hole transport unit comprising:
the first hole transport layer comprising the hole transporting material;
a second hole transport layer formed on the first hole transport layer and comprising the hole transporting material and the charge generating material, the third hole transport layer formed on the second hole transport layer and comprising the charge generating material;
a fourth hole transport layer formed on the third hole transport layer and comprising the hole transporting material and the charge generating material; and
the fifth hole transport layer formed on the fourth hole transport layer and comprising the hole transporting material; and
a second hole transport unit formed between the first hole transport unit and the emission layer, the second hole transport unit comprising:
a sixth hole transport layer formed on the fifth hole transport layer and comprising the hole transporting material; a seventh hole transport layer formed on the sixth hole transport layer and comprising the hole transporting material and the charge generating material;
an eighth hole transport layer formed on the seventh hole transport layer and comprising the charge generating material;
a ninth hole transport layer formed on the eighth hole transport layer and comprising the hole transporting material and the charge generating material; and
a tenth hole transport layer formed on the ninth hole transport layer and comprising the hole transporting material.

7. The organic light-emitting device of claim 6, wherein the sixth hole transport layer of the second hole transport unit is directly formed on the fifth hole transport layer of the first hole transport unit, and the fifth hole transport layer of the first hole transport unit and the sixth hole transport layer of the second hole transport unit are formed of the same hole transport material.

8. The organic light-emitting device of claim 1, wherein the electron transport layer comprises at least one electron transport unit comprising:
a first electron transport layer comprising the electron transporting material;
a third electron transport layer formed on the first electron transport layer and comprising the metal-containing material; and
a fifth electron transport layer formed on the third electron transport layer and comprising the electron transporting material.

9. The organic light-emitting device of claim 8, wherein the electron transport unit further comprises at least one layer selected from the group consisting of a second electron transport layer interposed between the first electron transport layer and the third electron transport layer and comprising the electron transporting material and the metal-containing material, and a fourth electron transport layer interposed between the third electron transport layer and the fifth electron transport layer and comprising the electron transporting material and the metal-containing material.

10. The organic light-emitting device of claim 8, wherein the electron transport layer comprises two electron transport units.

11. The organic light-emitting device of claim 1, wherein the first hole transport unit further comprises at least one layer selected from the group consisting of a second hole transport layer interposed between the first hole transport layer and the third hole transport layer and comprising the hole transporting material and the charge generating material, and a fourth hole transport layer interposed between the third hole transport layer and the fifth hole transport layer and comprising the hole transporting material and the charge generating material.

12. The organic light-emitting device of claim 11, wherein $R_{10}$ of Formula 2 is represented by $—(Ar_1)_n—CN$.

13. An organic light-emitting device comprising:
a substrate;
a first electrode formed on the substrate;
a second electrode;
an emission layer between the first electrode and the second electrode;
a hole transport layer between the first electrode and the emission layer, the hole transport layer comprising a first hole transport unit comprising: a first hole transport layer comprising a hole transporting material; a third hole transport layer formed on the first hole transport layer and comprising a charge generating material; and a fifth hole transport layer formed on the third hole transport layer and comprising the hole transporting material, each hole transport material independently selected from the group consisting of compounds represented by Formulae 1 and 2 and a combination thereof, each charge generating material independently represented by Formula 3:

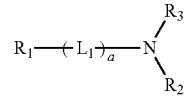
<Formula 1>

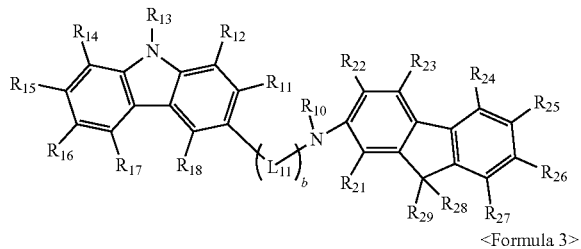
<Formula 2>

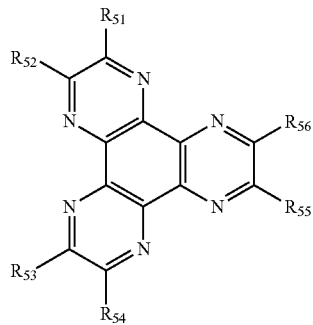
<Formula 3> wherein $R_{10}$ is represented by $—(Ar_1)_n—Ar_2$;
$R_{16}$ is represented by $—(Ar_{11})_m—Ar_{12}$;
$Ar_1$, $Ar_{11}$, $L_1$, and $L_{11}$ are each independently selected from the group consisting of a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_4$-$C_{30}$ heteroarylene group, and $—N(Q_1)—$;
n, m, a, and b are each independently an integer from 0 to 10;

$R_1$ through $R_3$, $R_{11}$ through $R_{15}$, $R_{17}$, $R_{18}$, $R_{21}$ through $R_{29}$, $Ar_2$, $Ar_{12}$, and $Q_1$ are each independently selected from the group consisting of a hydrogen atom, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, a substituted or unsubstituted $C_4$-$C_{30}$ heteroaryl group, and —N($Q_2$)($Q_3$); and $Q_2$ and $Q_3$ are each independently a hydrogen atom, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, and a substituted or unsubstituted $C_4$-$C_{30}$ heteroaryl group, wherein n groups of $Ar_1$ in —$(Ar_1)$— may be identical to or different from each other, m groups of $Ar_{11}$ in —$(Ar_{11})_m$— may be identical to or different from each other, a groups of $L_1$ in -$(L_1)_a$- may be identical to or different from each other, and b groups of $L_{11}$ in -$(L_{11})_b$- may be identical to or different from each other;

$R_{51}$ to $R_{56}$ are each independently selected from the group consisting of a hydrogen atom, —CN, —SOR$^{100}$, —SON(R$^{101}$)$_2$, —SO$_2$R$^{102}$, —SO$_2$N(R$^{103}$)$_2$, —SO$_3$R$^{104}$, —SO$_3$N(R$^{105}$)$^2$, —NO$_2$, —CFH$_2$, —CF$_2$H, and —CF$_3$, and R$^{100}$ to R$^{105}$ are each independently selected from the group consisting of a hydrogen atom, a substituted or unsubstituted $C_1$-$C_{30}$ alkyl group, a substituted or unsubstituted $C_5$-$C_{30}$ aryl group, and a substituted or unsubstituted $C_4$-$C_{30}$ heteroaryl group; and an electron transport layer between the second electrode and the emission layer, the electron transport layer comprising an electron transporting material and a metal-containing material wherein the electron transporting material contained in the electron transport layer is selected from the group consisting of Compound 60 and compounds represented by Formulae 4 and 5 and a combination thereof, and the metal-containing material contained in the electron transport layer comprises a Li complex:

<Compound 60>

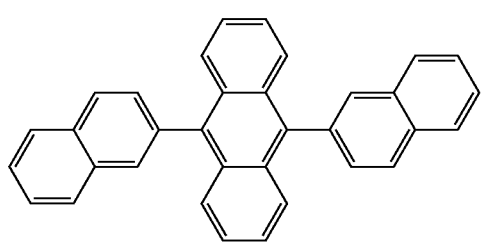

<Formula 4>

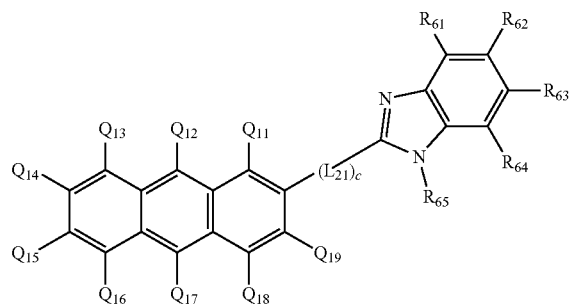

<Formula 5>

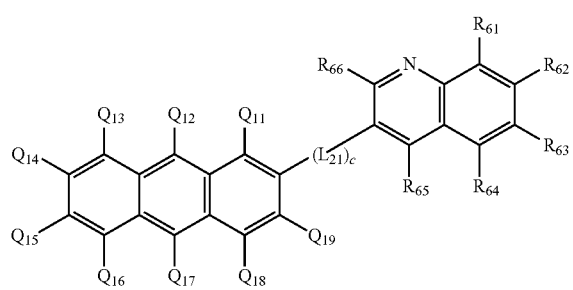

wherein $R_{61}$ to $R_{66}$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group, wherein at least two adjacent groups of $R_{61}$ to $R_{66}$ are selectively bonded to each other to form a saturated or unsaturated ring;

$L_{21}$ is a substituted or unsubstituted $C_1$-$C_{30}$ alkylene group, a substituted or unsubstituted $C_6$-$C_{30}$ arylene group, or a substituted or unsubstituted $C_3$-$C_{30}$ heteroarylene group;

$Q_{11}$ through $Q_{19}$ are each independently a hydrogen atom, a substituted or unsubstituted $C_6$-$C_{30}$ aryl group, or a substituted or unsubstituted $C_3$-$C_{30}$ heteroaryl group; and c is an integer from 0 to 10.

14. The organic light-emitting device of claim 13, wherein the hole transporting material is selected from the group consisting of Compounds 1 through 37:

1
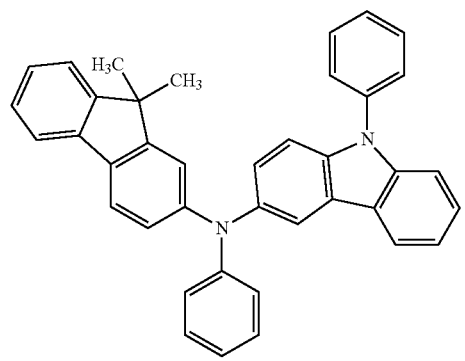
2
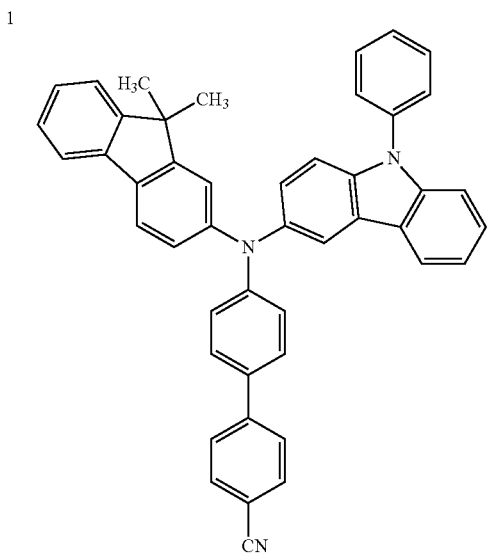
3
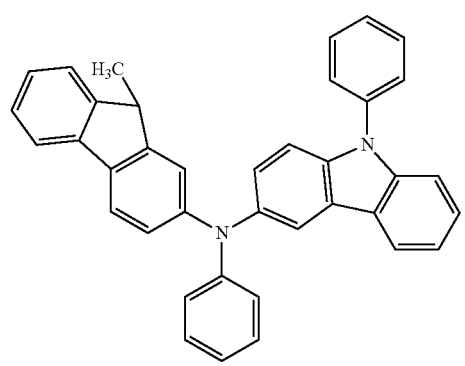
4
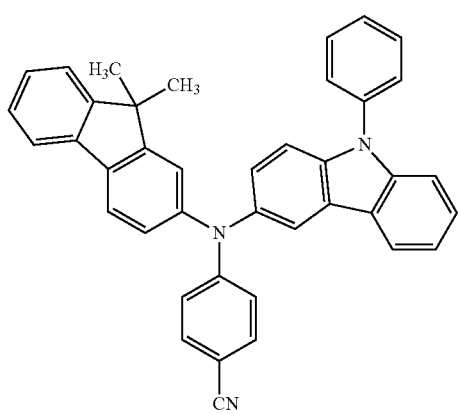
5
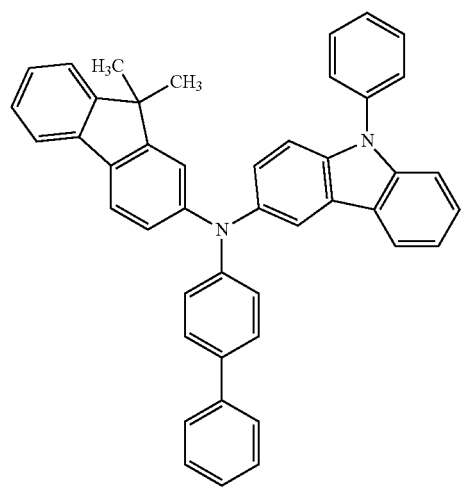
6
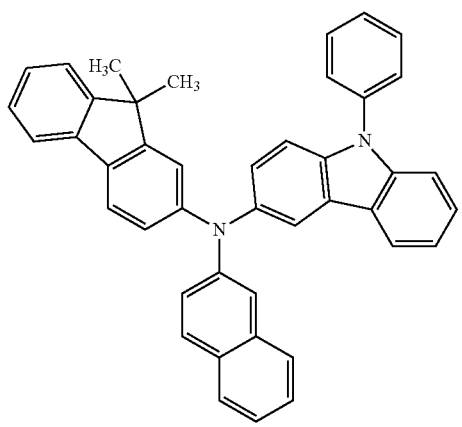

-continued
7
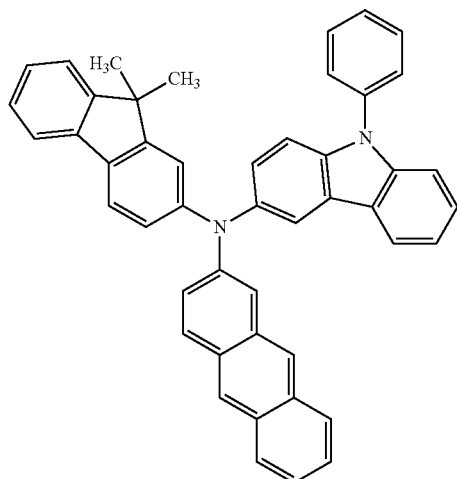
8
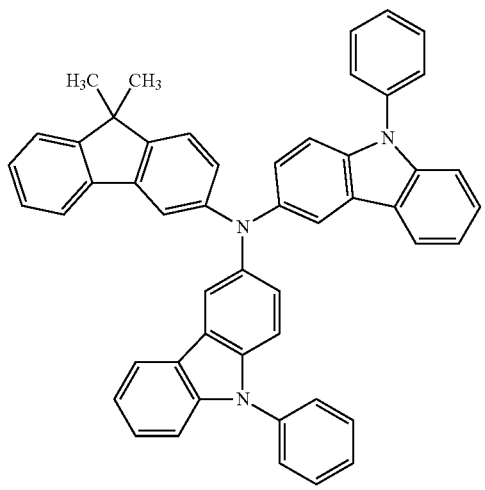
9
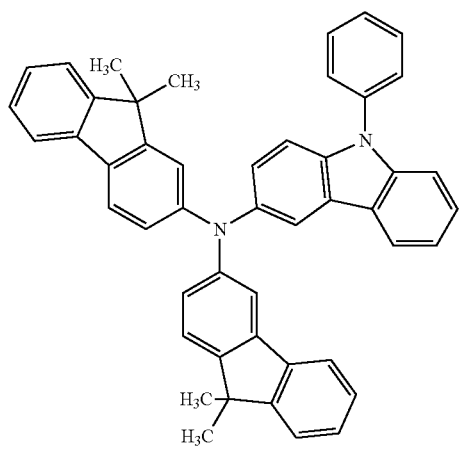
10
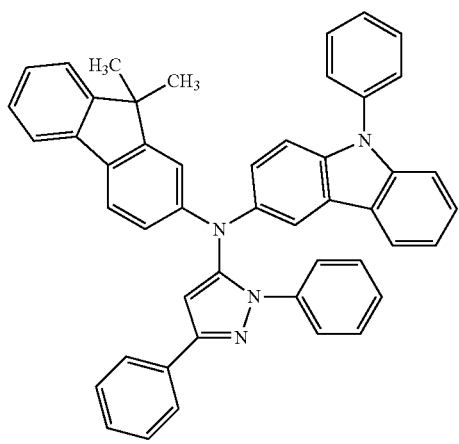
11
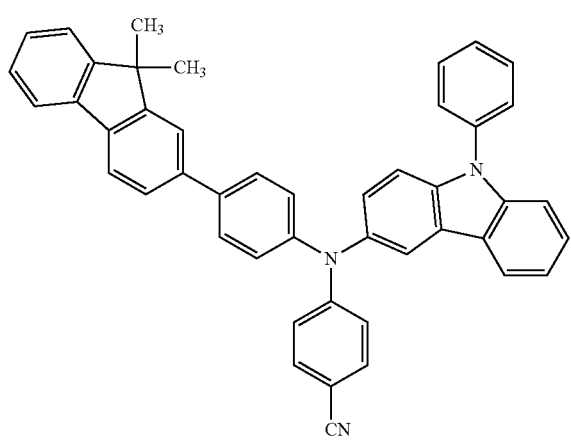
12
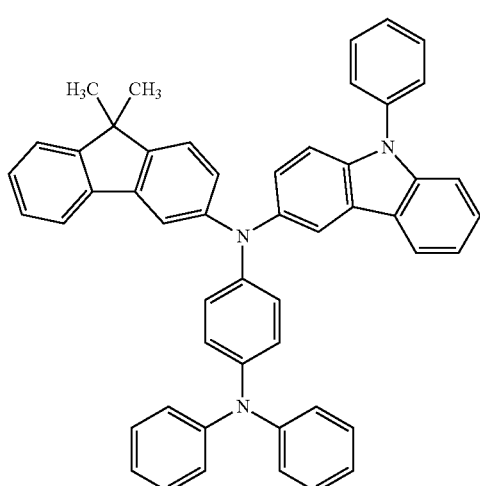

-continued
13
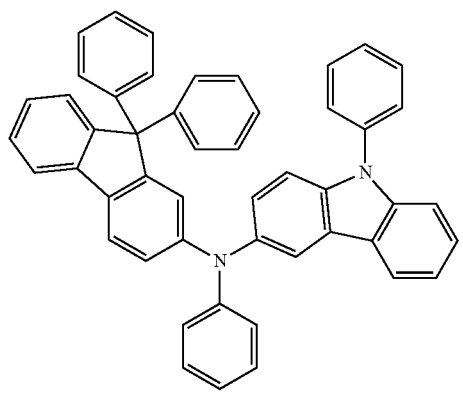
14
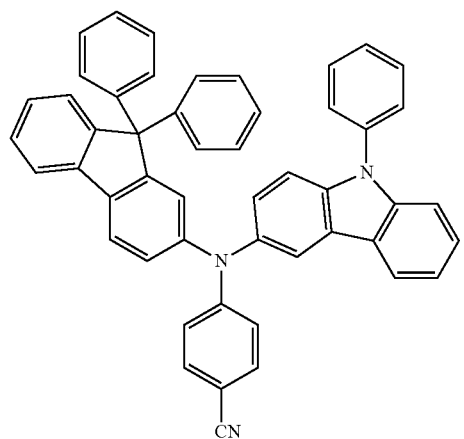
15
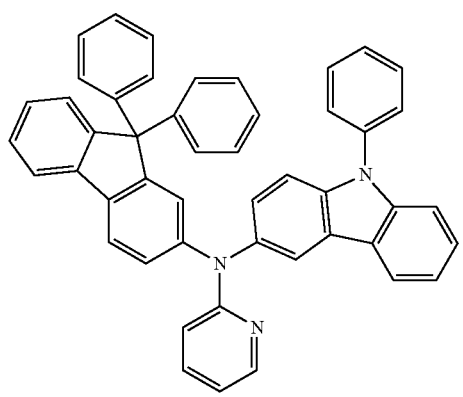
16
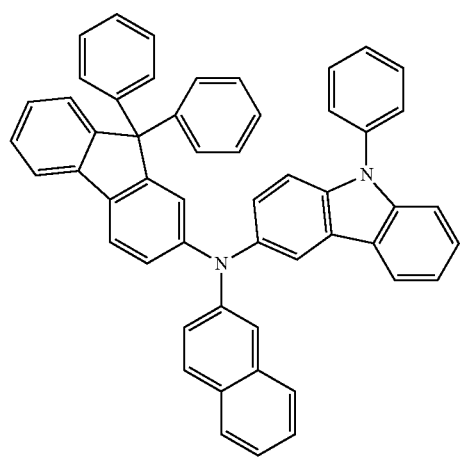
17
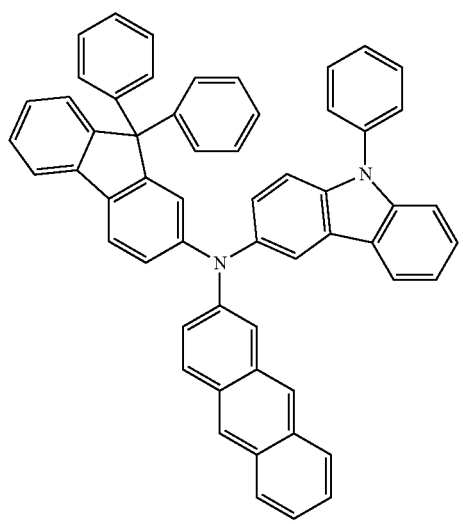
18
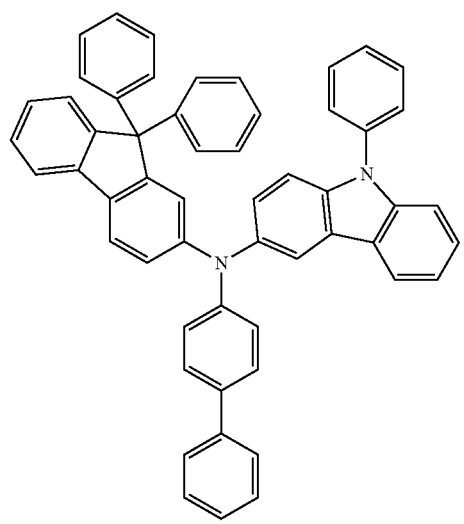

19
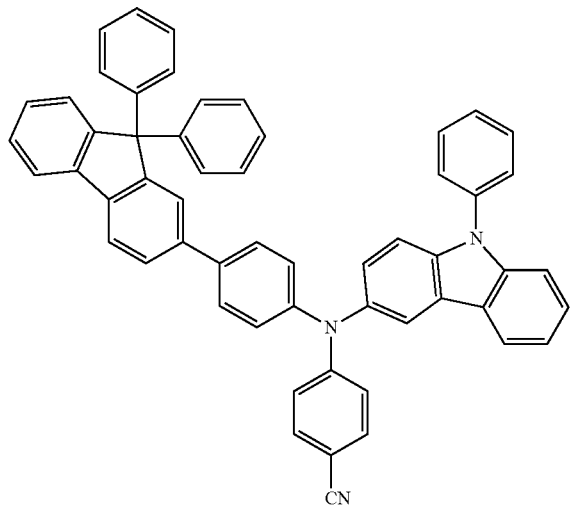
20
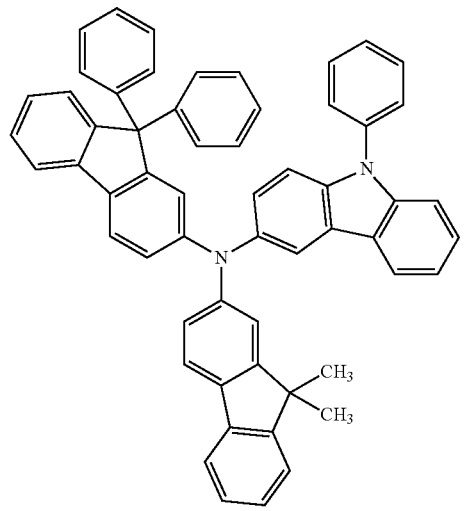
21
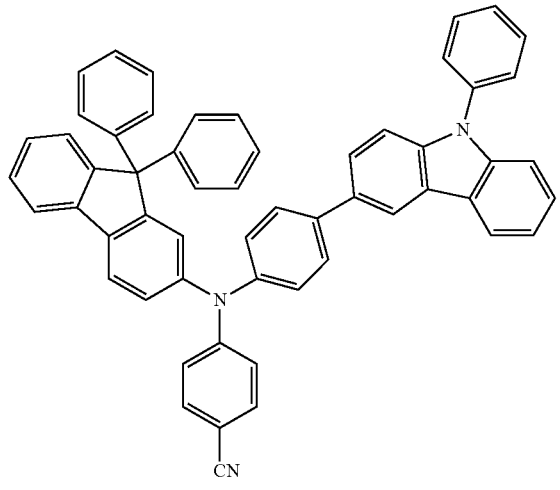
22
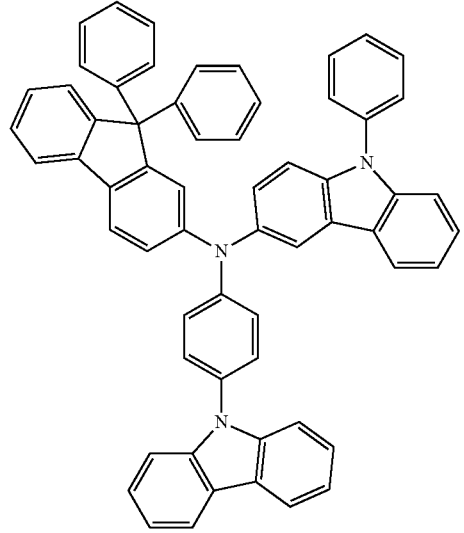

23
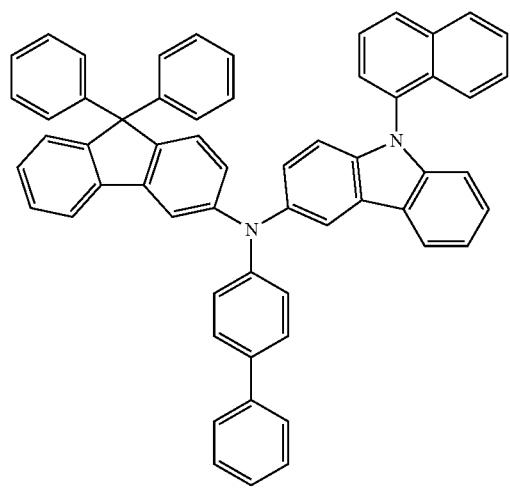
24
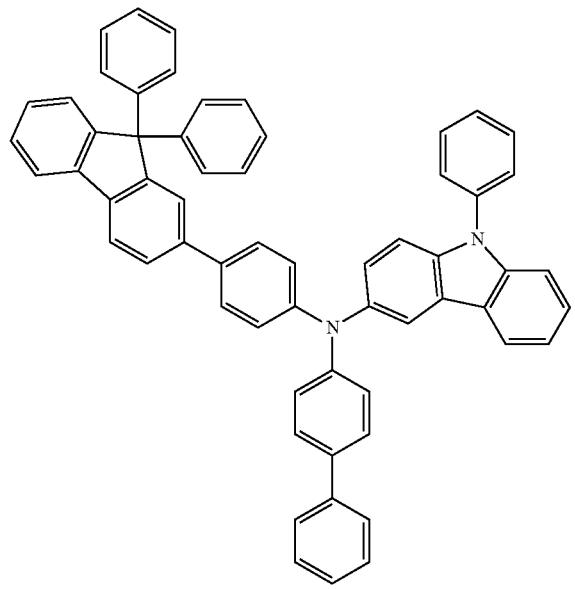
25
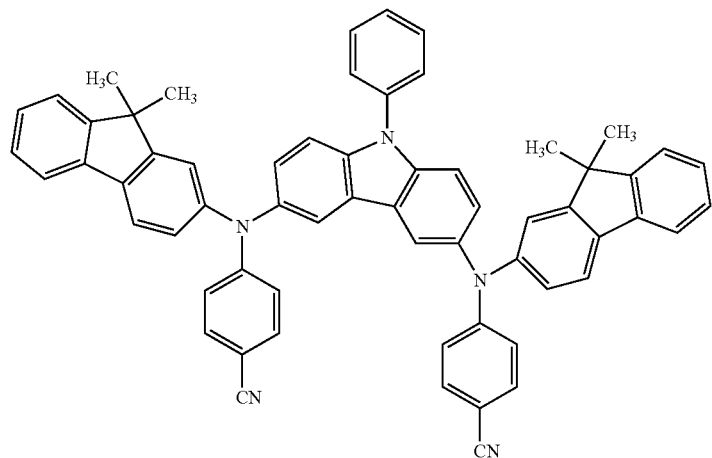
26
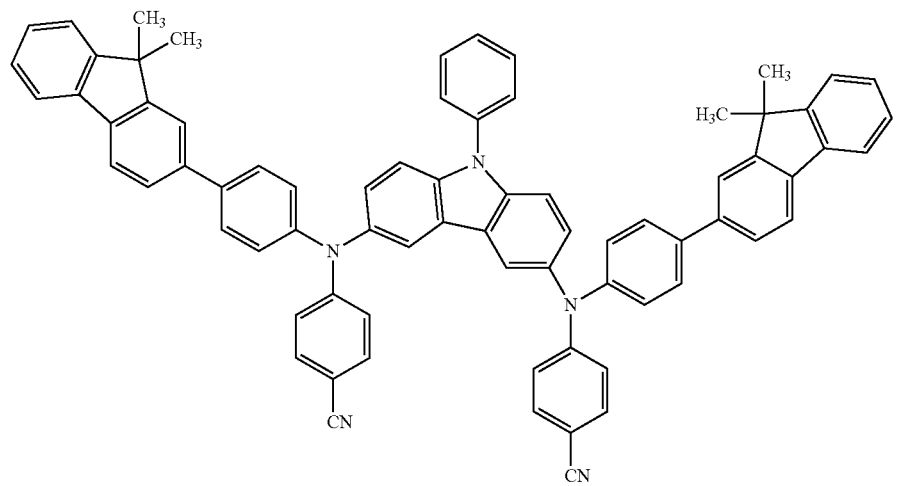

27
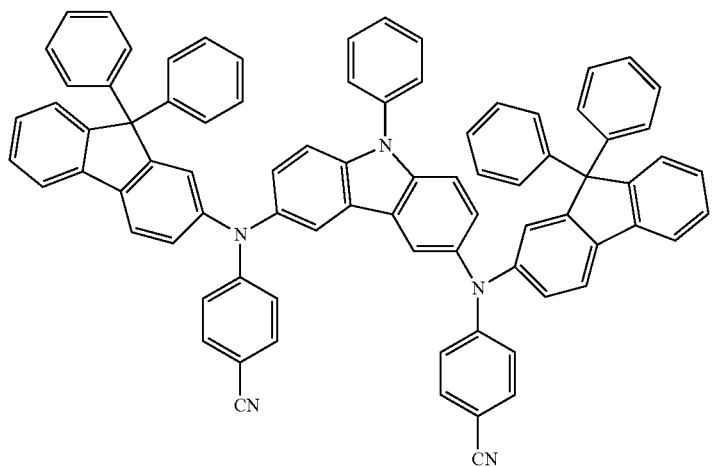
28
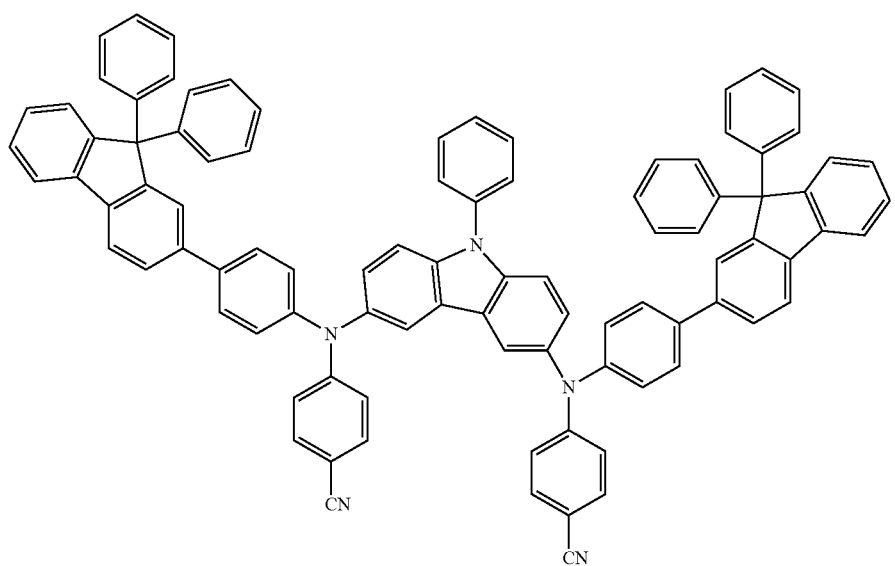
29
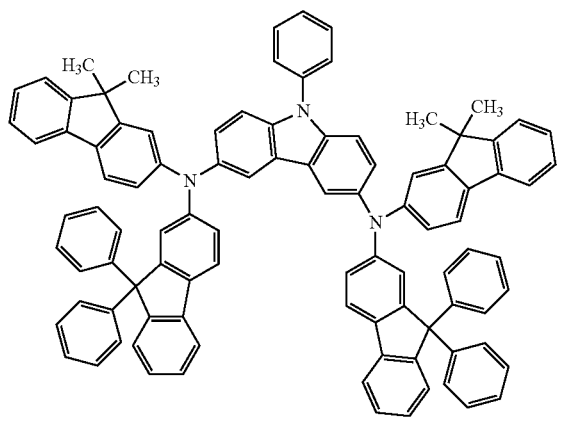
30
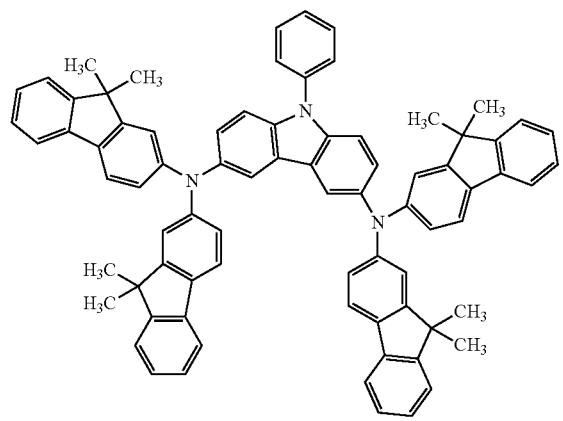

-continued
31
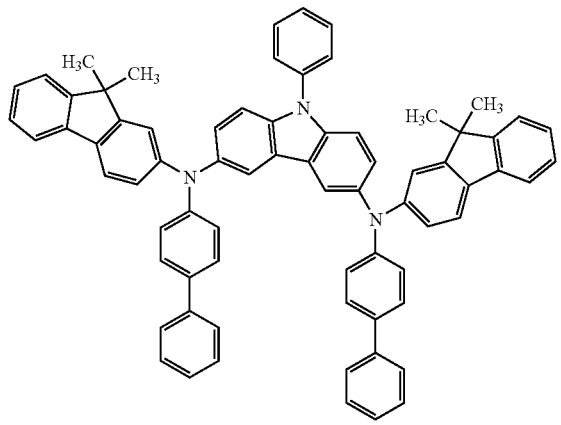
32
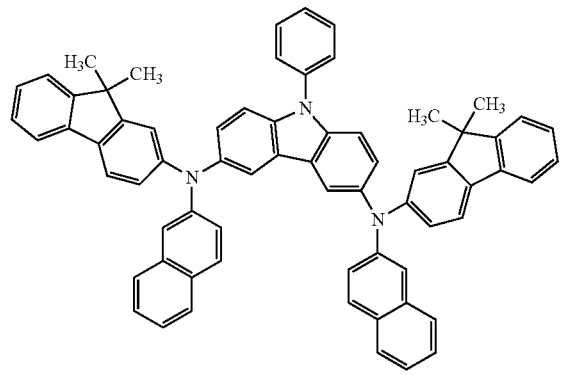
33
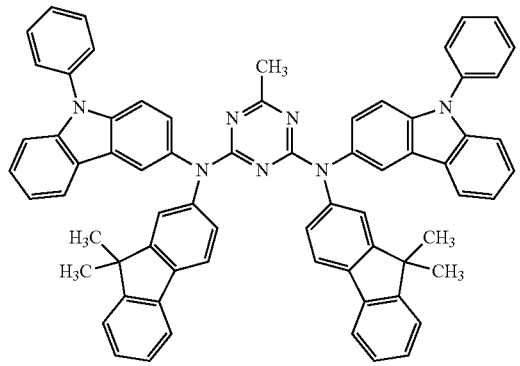
34
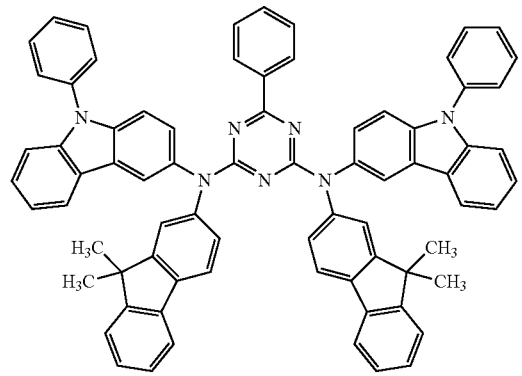
35
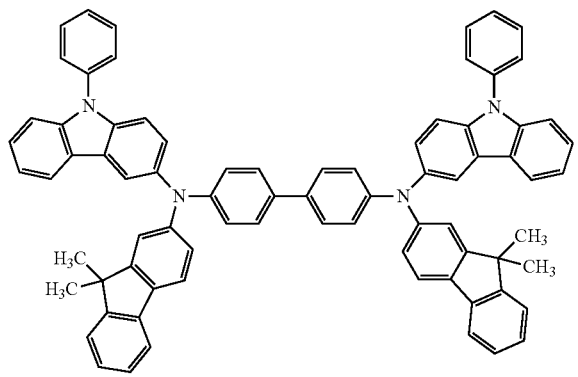
36
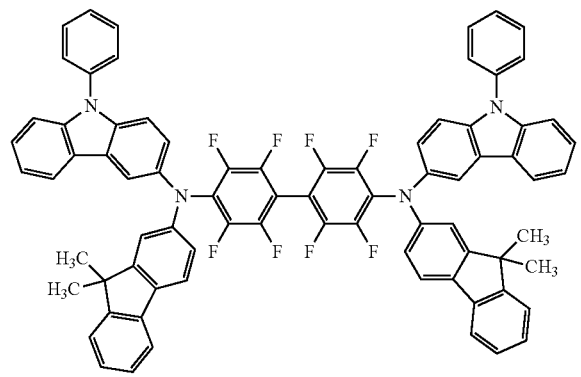

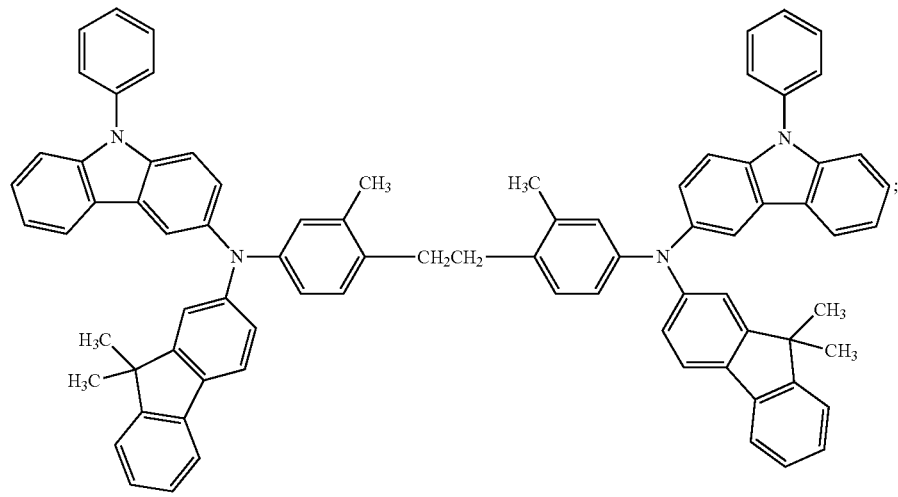
the charge generating material is Compound 40:
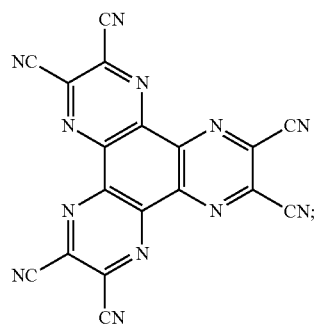
<Compound 40>
the electron transporting material contained in the electron transport layer is selected from the group consisting of Compound 60, Compound 61, Compound 62, and a combination thereof:
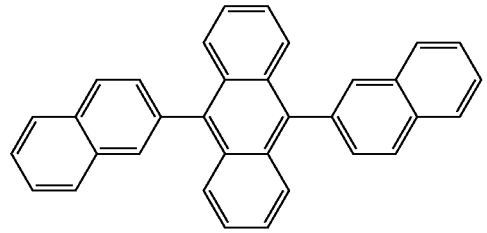
<Compound 60>
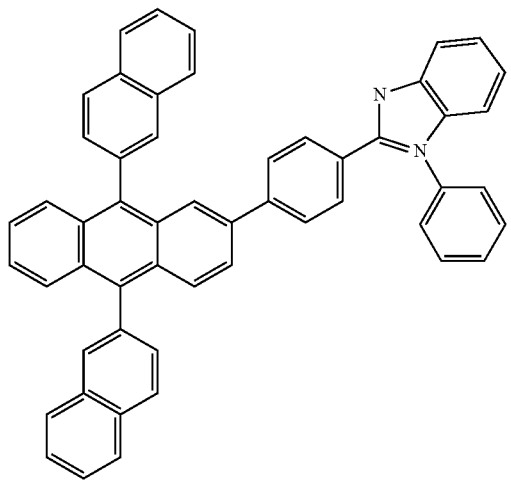
<Compound 61>
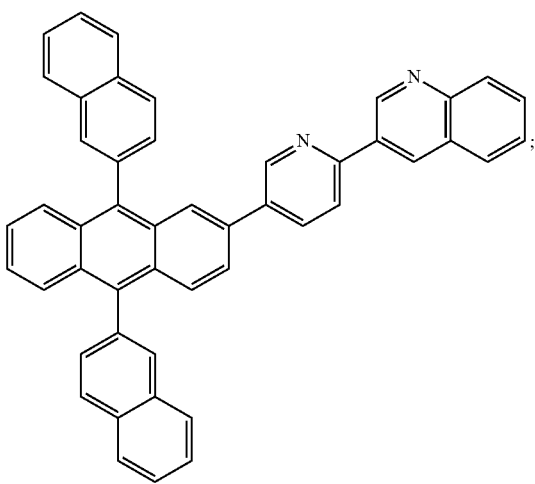
<Compound 62> and
the metal-containing material contained in the electron transport layer comprises at least one of lithium quinolate and Compound 81:

<Compound 81>

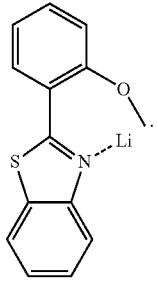

15. A method of manufacturing an organic light-emitting device of claim 1, the method comprising:
forming a first electrode on a substrate;
forming a hole transport layer on the first electrode by forming a first hole transport unit, the first hole transport unit comprising a first hole transport layer comprising a hole transporting material; a third hole transport layer formed on the first hole transport layer and comprising a charge generating material; and a fifth hole transport layer formed on the third hole transport layer and comprising the hole transporting material;
forming an emission layer on the hole transport layer;
forming an electron transport layer comprising an electron transporting material and a metal-containing material on the emission layer; and
forming a second electrode on the electron transport layer.

16. The method of claim 15, wherein the formation of the hole transport layer comprises:
preparing a first deposition source releasing the hole transporting material and a second deposition source releasing the charge generating material;
disposing an anti-deposition plate between the first deposition source and the second deposition source; and
performing at least one reciprocation of the first deposition source and the second deposition source from a first end to a second end, and then the second end to the first end of a region in which the hole transport layer is formed.

17. The method of claim 16, wherein the first hole transport unit further comprises at least one layer selected from the group consisting of a second hole transport layer interposed between the first hole transport layer and the third hole transport layer and comprising the hole transporting material and the charge generating material, and a fourth hole transport layer interposed between the third hole transport layer and the fifth hole transport layer and comprising the hole transporting material and the charge generating material, and the formation of the hole transport layer comprises:
preparing a first deposition source releasing the hole transporting material and a second deposition source releasing the charge generating material;
disposing the first deposition source and the second deposition source to be spaced apart from each other such that a region to which the hole transporting material is released overlaps a region to which the charge generating material is released; and
performing at least one reciprocation of the first deposition source and the second deposition source from a first end to a second end, and then the second end to the first end of a region in which the hole transport layer is formed.

18. The organic light-emitting device of claim 12, wherein the hole transporting material comprises:

<Compound 14>

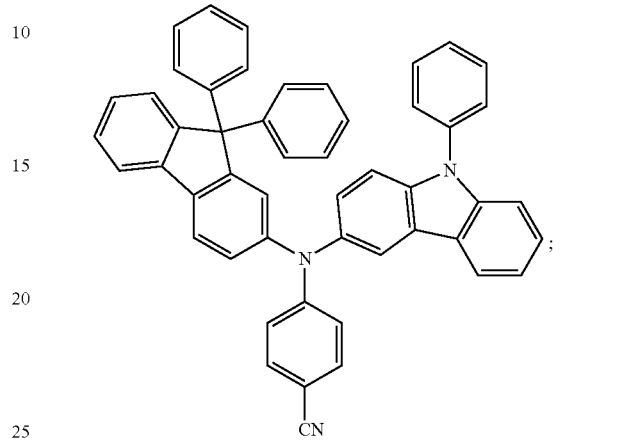

the charge generating material comprises:

<Compound 40>

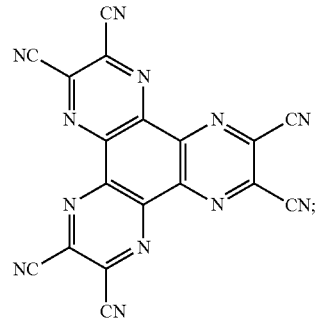

the electron transporting material comprises:

<Compound 62>

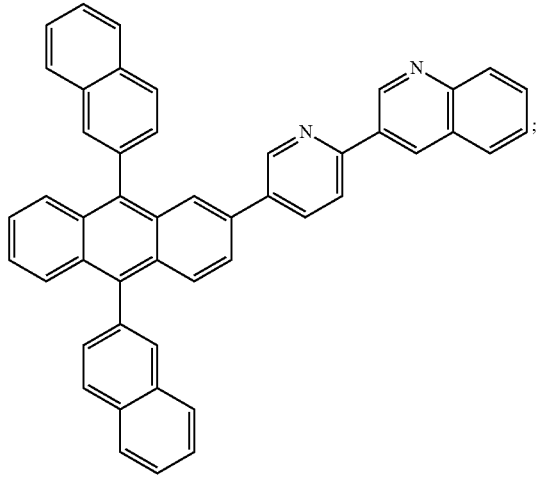

and
the metal-containing material comprises LiQ.

* * * * *